US010666286B1

(12) United States Patent
Cattivelli et al.

(10) Patent No.: US 10,666,286 B1
(45) Date of Patent: May 26, 2020

(54) PARTITIONED DELTA-SIGMA MODULATOR FOR HIGH-SPEED APPLICATIONS

(71) Applicant: Avago Technologies International Sales Pte. Limited, Singapore (SG)

(72) Inventors: Federico Santiago Cattivelli, Rancho Santa Margarita, CA (US); Gozde Sahinoglu, Laguna Hills, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/264,589

(22) Filed: Jan. 31, 2019

(51) Int. Cl.
*H03M 3/00* (2006.01)

(52) U.S. Cl.
CPC ............ *H03M 3/416* (2013.01); *H03M 3/42* (2013.01); *H03M 3/448* (2013.01); *H03M 3/454* (2013.01); *H03M 3/46* (2013.01)

(58) Field of Classification Search
CPC .... H03M 3/414; H03M 7/3022; H03M 3/358; H03M 1/12; H03M 3/458; H03M 3/50; H03M 1/66; H03M 3/368; H03M 3/422; H03M 3/454; H03M 7/3004; H03M 3/416; H03M 3/436; H03M 3/46
USPC ......................................... 341/143, 118, 120
See application file for complete search history.

(56) References Cited

U.S. PATENT DOCUMENTS

| | | | | | |
|---|---|---|---|---|---|
| 5,124,703 | A * | 6/1992 | Kaneaki | ............. | H03M 7/3022 341/143 |
| 5,416,483 | A * | 5/1995 | Matsuya | ............. | H04B 14/046 341/143 |
| 6,577,259 | B1 * | 6/2003 | Jelonnek | ............. | H03M 7/3022 341/143 |
| 7,411,527 | B2 * | 8/2008 | Kitahira | ................ | H03M 3/362 327/105 |
| 7,532,141 | B2 * | 5/2009 | Kitahira | ................ | H03M 3/358 332/109 |
| 8,169,351 | B2 * | 5/2012 | Lee | ........................ | H03M 3/356 341/143 |
| 8,421,660 | B1 * | 4/2013 | Wan | ...................... | H03M 3/392 341/118 |
| 9,941,897 | B1 * | 4/2018 | Li | ........................... | H03M 1/68 |
| 2002/0121994 | A1 * | 9/2002 | Bolton, Jr. | ............ | H03L 7/1976 341/143 |
| 2005/0057384 | A1 * | 3/2005 | Chen | ...................... | H03M 1/005 341/143 |

(Continued)

*Primary Examiner* — Linh V Nguyen
(74) *Attorney, Agent, or Firm* — Morgan, Lewis & Bockius LLP

(57) ABSTRACT

A partitioned delta-sigma modulator for high-speed applications includes a plurality of modulation stages arranged in parallel to input and output terminals of the modulator and interconnected to one another in series. In some aspects, each of the plurality of modulation stages is configured to combine a first error signal from a prior modulation stage of the plurality of modulation stages with a first digital signal to produce an adder signal. In some aspects, the first error signal includes a delay from the prior modulation stage. Each of the plurality of modulation stages is also configured to convert the adder signal having a first bit width into a quantized signal having a second bit width smaller than the first bit width. Each of the modulation stages is also configured to provide a second error signal based on the quantized signal to a subsequent modulation stage of the plurality of modulation stages.

20 Claims, 16 Drawing Sheets

(56) References Cited

U.S. PATENT DOCUMENTS

| | | | | |
|---|---|---|---|---|
| 2008/0180293 | A1* | 7/2008 | Kitahira | H03M 3/358 |
| | | | | 341/144 |
| 2009/0128384 | A1* | 5/2009 | Di Giandomenico | ........................ |
| | | | | H03M 3/398 |
| | | | | 341/143 |
| 2013/0063293 | A1* | 3/2013 | Zhang | H03M 7/3002 |
| | | | | 341/143 |
| 2017/0353191 | A1* | 12/2017 | Weng | H03M 3/326 |

* cited by examiner

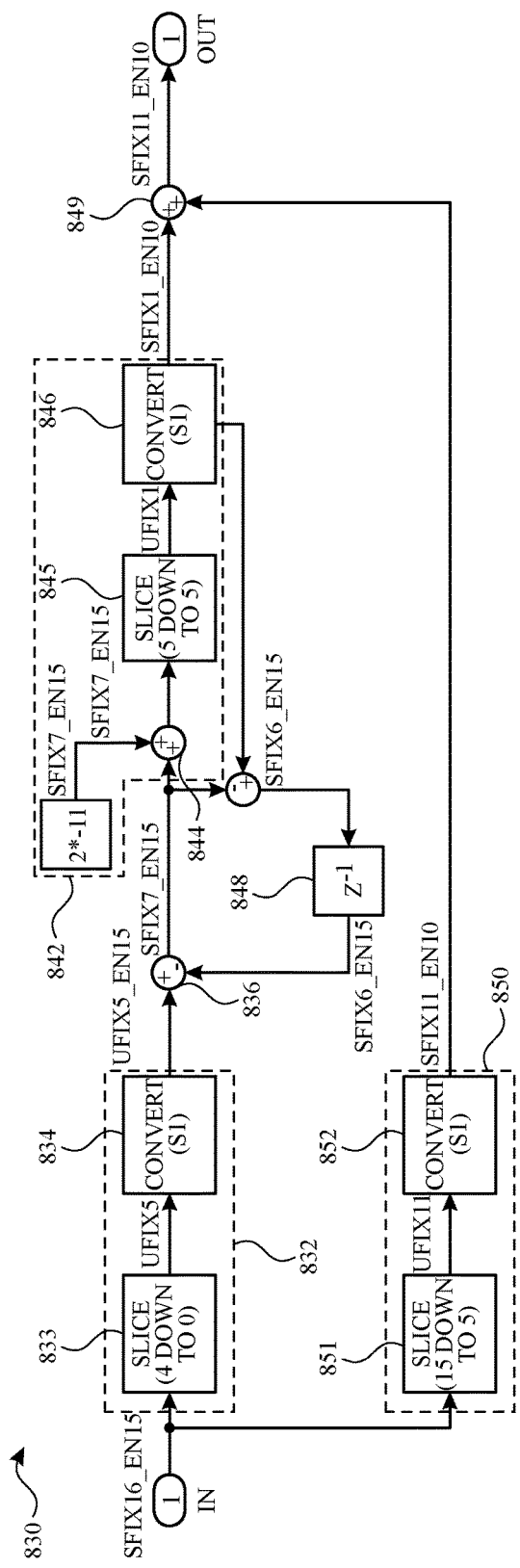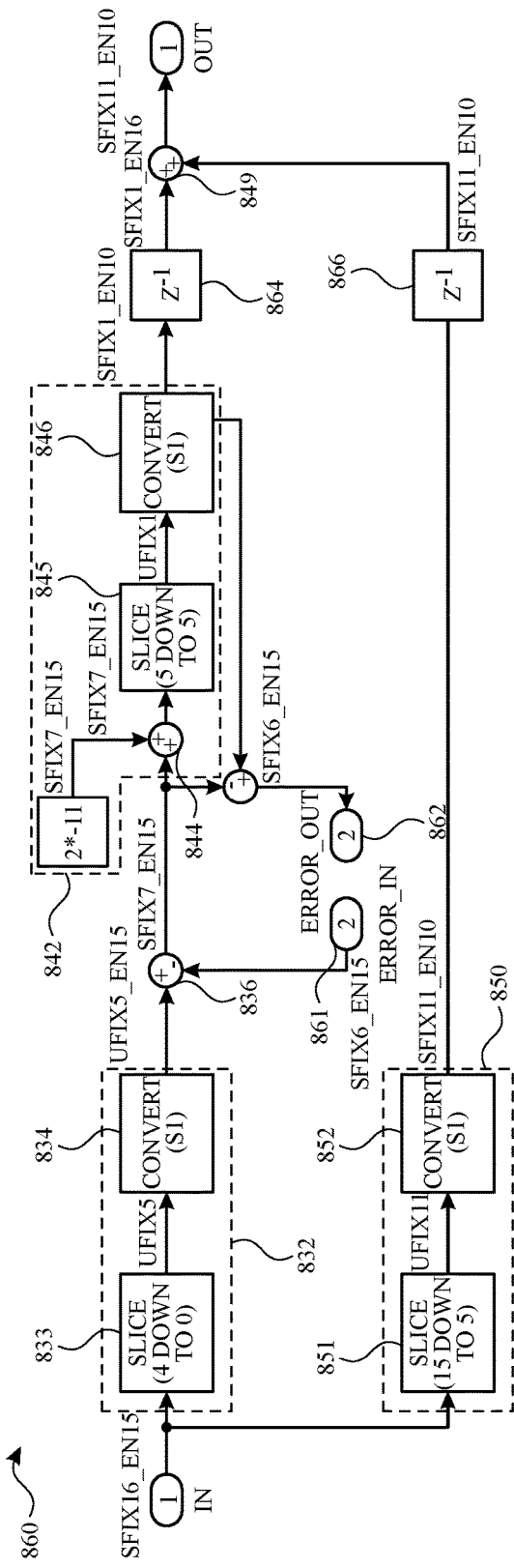
FIG. 8B
FIG. 8C

US 10,666,286 B1

PARTITIONED DELTA-SIGMA MODULATOR FOR HIGH-SPEED APPLICATIONS

TECHNICAL FIELD

The present disclosure relates generally to wireless communication devices, and in particular, to high-speed digital transmitter for wireless communication systems.

BACKGROUND

Existing transmitters for wireless communications, such as Bluetooth and WiFi transmitters, typically use analog implementations, which require a large area, and multiple calibrations to achieve optimal performance. Furthermore, existing transmitters utilize delta-sigma-modulators to re-quantize signals to a lower number of bits between digital and analog domains, while shaping the quantization noise to a desired profile.

BRIEF DESCRIPTION OF THE DRAWINGS

Certain features of the subject technology are set forth in the appended claims. However, for purpose of explanation, several embodiments of the subject technology are set forth in the following figures.

Certain features of the subject technology are set forth in the appended claims. However, for purpose of explanation, one or more implementations of the subject technology are set forth in the following figures.

FIG. 8B illustrates a schematic diagram of another example of a DSM partitioned into MSB and LSB paths according to one or more implementations of the subject technology.

FIG. 8C illustrates a schematic diagram of another example of the DSM illustrated in FIG. 8B according to one or more implementations of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

As wireless devices become more complex, multiple radios are added to a single integrated circuit, to support multiple antennas or multiple connections. One problem in traditional transmitters having multiple radios is the increased area footprint of each radio that is added. In contrast, the subject technology includes a digital transmitter (Tx) architecture that has a very small area footprint, and has almost no analog components, and therefore is less complex to tune and optimize, saving resources and time. The area footprint of the digital transmitter is minimal, and almost no analog calibrations are required. The transmitter can be used to transmit any Bluetooth or WiFi packet type, regardless of bandwidth. For example, the digital transmitter architecture can operate in the 2.4 GHz ISM band.

Furthermore, the availability of 7 nm technology has spurred a new type of digital architecture for digital transmitters that requires the use of digital DSMs running at speeds as high as 4.8 GHz. These modulators are required to quantize the digital signal to a given number of bits (e.g. quantize from 16-bit signal to 6 bits). The subject technology, in contrast, uses mathematical techniques to split the design into simpler components, meet timing with standard cell libraries, and save design time and power. For example, by partitioning the DSM design as described in the subject disclosure, the DSM can be implemented, can meet timing, and can be verified using standard digital tools and techniques. At the same time, high-speed parallel implementations are known to consume less power than traditional serial implementations, at the expense of area.

Figure 1:
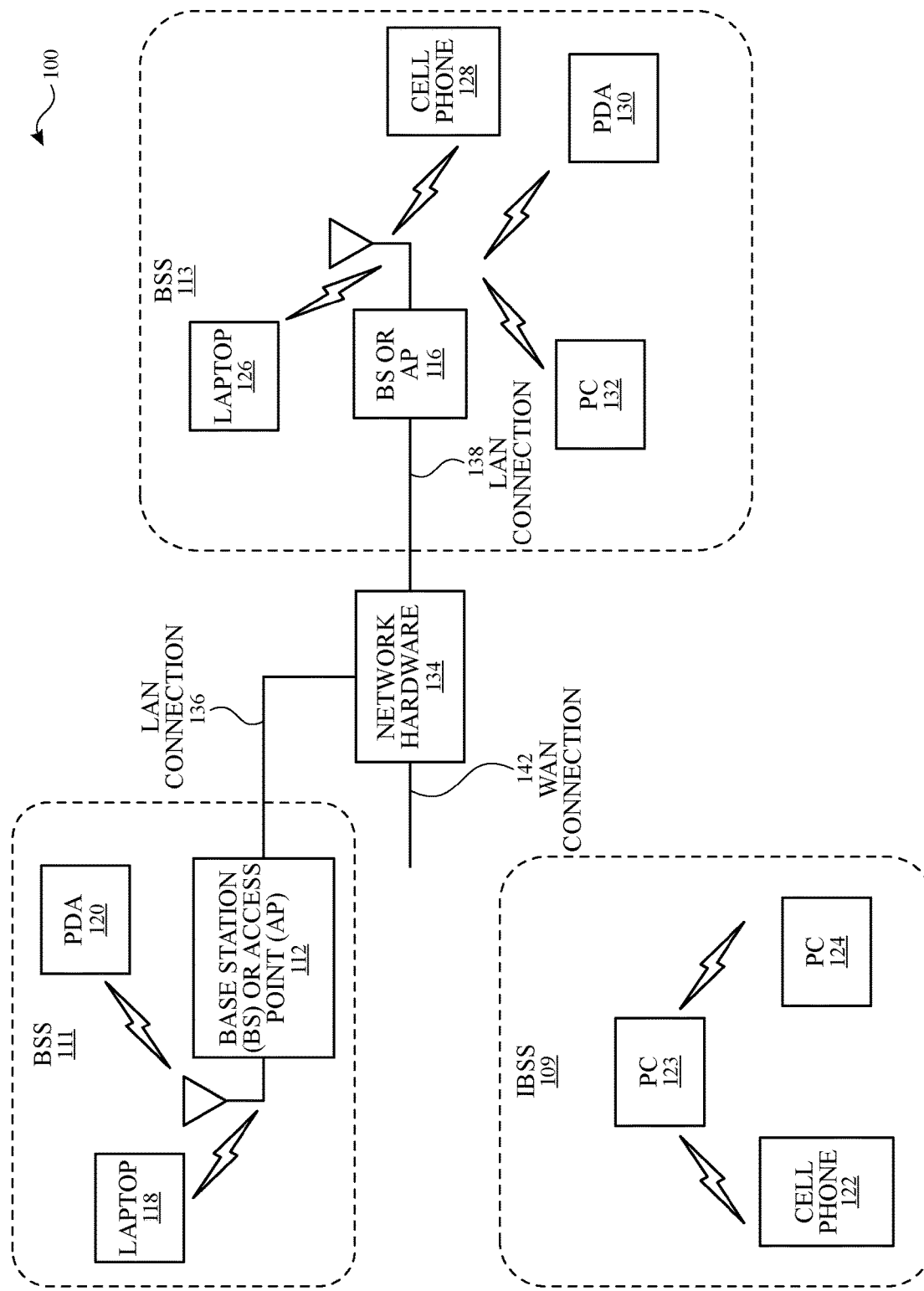
FIG. 1 is a diagram illustrating wireless communication system in accordance with one or more implementations.

FIG. 1 is a diagram illustrating wireless communication system 100 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Wireless communication system 100 includes base stations and/or access points 112, 116, wireless communication devices 118-132 and a network hardware component 134. Note that the network hardware 134, which may be a router, switch, bridge, modem, or system controller, provides a wide area network connection 142 for the wireless communication system 100. Further note that wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within independent basic service set (IBSS) area 109 and communicate directly (e.g., point to point). In this configuration, wireless communication devices 122, 123, and 124 may only communicate with each other. To communicate with other wireless communication devices within the wireless communication system 100 or to communicate outside of the wireless communication system 100, wireless communication devices 122, 123, and/or 124 can affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access points 112, 116 with connectivity to other devices within the wireless communication system 100 and provides connectivity to other networks via the WAN connection 142. To communicate with wireless communication devices 118-132 within BSS 111 and 113, each of the base stations or access points 112, 116 has an associated antenna or antenna array. In one or more implementations, base station or access point 112 wirelessly communicates with wireless communication devices 118 and 120 while base station or access point 116 wirelessly communicates with wireless communication devices 126-132. Wireless communication devices 118-132 can register with a particular base station or access point 112, 116 to receive services from the wireless communication system 100.

According to some implementations, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), enhanced data rates for GSM evolution (EDGE), general packet radio service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
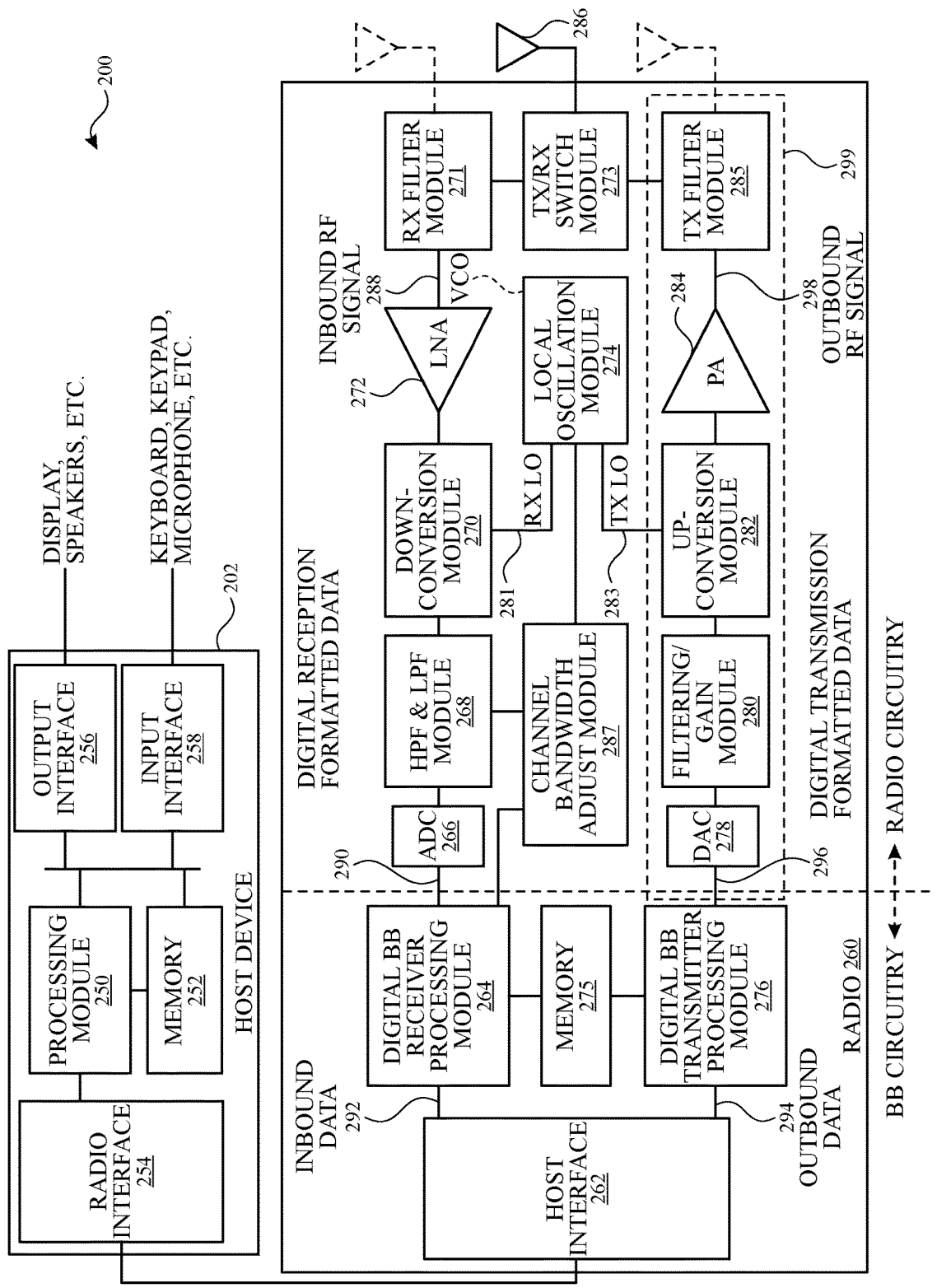
FIG. 2 is a diagram illustrating a wireless communication device that includes a host device and associated radio.

FIG. 2 is a diagram illustrating a wireless communication device 200 that includes a host device 202 (e.g., wireless communication devices 118-132) and associated radio 260. For cellular telephone hosts, radio 260 is a built-in component. For personal digital assistant hosts, laptop hosts, and/or personal computer hosts, the radio 260 may be built-in or an externally coupled component.

As illustrated, host device 202 includes processing module 250, memory 252, radio interface 254, input interface 258, and output interface 256. Processing module 250 is configured to execute instructions stored in memory 275 to provide functions that can be performed by host device 202. For example, for a cellular telephone host device, processing module 250 performs the corresponding communication functions in accordance with a particular cellular telephone standard.

Radio interface 254 allows data to be received from and sent to radio 260. For data received from the radio 260 (e.g., inbound data), radio interface 254 provides the data to processing module 250 for further processing and/or routing to output interface 256. Output interface 256 provides connectivity to an output display device such as a display, monitor, or speakers, such that the received data may be presented. Radio interface 254 also provides data from processing module 250 to radio 260. Processing module 250 may receive the outbound data from an input device such as a keyboard, keypad, or microphone via input interface 258 or generate the data itself. For data received via input interface 258, processing module 250 may perform a corresponding host function on the data and/or route it to radio 260 via radio interface 254.

Radio 260 includes host interface 262, digital baseband (BB) receiver processing module 264, analog-to-digital converter 266, high pass and low pass filter module 268, inter-frequency (IF) mixing down conversion stage 270, receiver filter module 271, low noise amplifier 272, transmitter/receiver switch 273, local oscillation module 274 (which may be implemented, at least in part, using a voltage controlled oscillator (VCO)), memory 275, digital BB transmitter processing module 276, radio transmitter circuit 299, channel bandwidth adjust module 287, and antenna 286.

As shown in FIG. 2, the radio transmitter circuit 299 is a traditional implementation of a transmitter architecture. In one or more aspects, radio transmitter circuit 299 includes digital-to-analog converter 278, filtering/gain module 280, intermediate frequency (IF) mixing up-conversion module 282, power amplifier 284 and transmitter filter module 285. Antenna 286 may be a single antenna that is shared by the transmit and receive paths as regulated by Tx/Rx switch module 273, or may include separate antennas for the transmit path and receive path. The antenna implementation will depend on the particular standard to which the wireless communication device is compliant.

Digital receiver processing module 264 and digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion.

Digital receiver and transmitter processing modules 264 and 276 may be implemented using a shared processing device, individual processing devices, or multiple processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 275 may be a single memory device or multiple memory devices. Such a memory device may be a read-only memory, random access memory, volatile memory, non-volatile memory, static memory, dynamic memory, flash memory, and/or any device that stores digital information. Note that when processing module 264 and/or 276 implements one or more of its functions via a state machine, analog circuitry, digital circuitry, and/or logic circuitry, the memory storing the corresponding operational instructions is embedded with the circuitry including the state machine, analog circuitry, digital circuitry, and/or logic circuitry.

In operation, radio 260 receives outbound data 294 from host device 202 via host interface 262. Host interface 262 routes outbound data 294 to digital transmitter processing module 276, which processes outbound data 294 in accordance with a particular wireless communication standard (e.g., IEEE 802.11, Bluetooth, ZigBee, WiMAX (Worldwide Interoperability for Microwave Access), or any other type of radio frequency based network protocol and/or variations thereof) to produce digital transmission formatted data 296. Outbound baseband signals 296 can be digital base-band signals (e.g., have a zero IF) or digital low IF signals, where the low IF can be in the frequency range of one hundred kHz (kilo-Hertz) to a few MHz (Mega-Hertz).

Digital-to-analog converter 278 converts outbound baseband signals 296 from the digital domain to the analog domain. Filtering/gain module 280 filters and/or adjusts the gain of the analog signals prior to providing the signals to up-conversion module 282. Up-conversion module 282 converts the analog baseband or low IF signals into radio frequency (RF) signals based on transmitter local oscillation 283 provided by local oscillation module 274. Power amplifier 284 amplifies the RF signals to produce outbound RF signals 298, which are filtered by transmitter filter module 285. Antenna 286 transmits outbound RF signals 298 to a targeted device such as a base station, an access point and/or another wireless communication device.

Radio 260 also receives inbound RF signals 288 via antenna 286, which are transmitted by a base station, an access point, or another wireless communication device. Antenna 286 provides inbound RF signals 288 to receiver filter module 271 via Tx/Rx switch 273, where Rx filter 271 bandpass filters inbound RF signals 288. Rx filter 271 provides the filtered RF signals to low noise amplifier 272, which amplifies inbound RF signals 288 to produce amplified inbound RF signals. Low noise amplifier 272 provides the amplified inbound RF signals to IF mixing module 270, which directly converts the amplified inbound RF signals into an inbound low IF signals or baseband signals based on receiver local oscillation 281 provided by local oscillation module 274. Down conversion module 270 provides the inbound low IF signals or baseband signals to filtering/gain module 268. High pass and low pass filter module 268 filters, based on settings provided by channel bandwidth adjust module 287, the inbound low IF signals or the inbound baseband signals to produce filtered inbound signals.

Analog-to-digital converter 266 converts the filtered inbound signals from the analog domain to the digital domain to produce digital reception formatted data 290, where inbound baseband signals 290 will be digital baseband signals or digital low IF signals, where the low IF typically will be in the frequency range of one hundred kHz to a few MHz. Digital receiver processing module 264, based on settings provided by channel bandwidth adjust module 287, decodes, descrambles, demaps, and/or demodulates inbound baseband signals 290 to recapture inbound data 292 in accordance with the particular wireless communication standard being implemented by radio 260. Host interface 262 provides recaptured inbound data 292 to host device 202 via radio interface 254.

Wireless communication device 200 may be implemented using one or more integrated circuits. For example, the host device 202 may be implemented on a first integrated circuit, digital receiver processing module 264, digital transmitter processing module 276 and memory 275 may be implemented on a second integrated circuit, and the remaining components of radio 260, less antenna 286, may be implemented on a third integrated circuit. Alternatively, radio 260 may be implemented on a single integrated circuit. As yet another example, processing module 250 of host device 202 and digital receiver and transmitter processing modules 264 and 276 may be a common processing device implemented on a single integrated circuit. Further, memory 252 and memory 275 may be implemented on a single integrated circuit and/or on the same integrated circuit as the common processing modules of processing module 250 and digital receiver and transmitter processing module 264 and 276.

Any of the various embodiments of the wireless communication device 200 that may be implemented within various communication systems can incorporate functionality to perform communication via more than one standard, protocol, or other predetermined means of communication. For example, the wireless communication device 200 implemented as a single communication device, can include functionality to perform communication in accordance with a first protocol, a second protocol, and/or a third protocol. These various protocols may be WiMAX (Worldwide Interoperability for Microwave Access) protocol, a protocol that complies with a wireless local area network (e.g., WLAN/WiFi) (e.g., one of the IEEE (Institute of Electrical and Electronics Engineer) 802.11 protocols such as 802.11a, 802.11b, 802.11g, 802.11n, 802.11ac or 802.11ax), a Bluetooth protocol, or any other predetermined means by which wireless communication may be effectuated.

Most wireless Tx radios are implemented as a cascade of analog blocks, such as DAC, LPF, Mixer, PA driver and PA. Each one of these blocks requires its own tuning and calibration to achieve optimal performance. Some examples are LO-feedthrough calibration, I/Q imbalance calibration, Tx power calibration, LPF bandwidth calibration, etc. These calibrations are time consuming, power consuming, risky, and overall expensive. In contrast, the subject technology includes a fully digital Tx that alleviates the requirements for substantial analog calibrations. As digital standard cells become smaller, it becomes increasingly feasible to implement as much as possible of the transmit chain in the digital domain. This alleviates the requirements of calibrations since digital circuits provide a more predictable performance.

In prior approaches, a digital transmitter architecture for Bluetooth, for example, up-samples the digital baseband signal to about 400 MHz, and then converts it to an analog signal before going through up-conversion (or frequency mixing operation) and amplification. In contrast, the subject technology up-samples the digital signal to 4.8 GHz, and the only analog block required in the transmit path is a high-speed DAC. The high resolution DAC is able to achieve a low out-of-band power spectral density, as required by future Bluetooth and WiFi applications. A voltage-controlled oscillator (VCO) provides the required clocks for digital operation. In some implementations, the digital Tx path can exhibit strong spurs at odd harmonics of the LO frequency (e.g. 7.2 GHz, 9.6 GHz, etc.).

Figure 3:
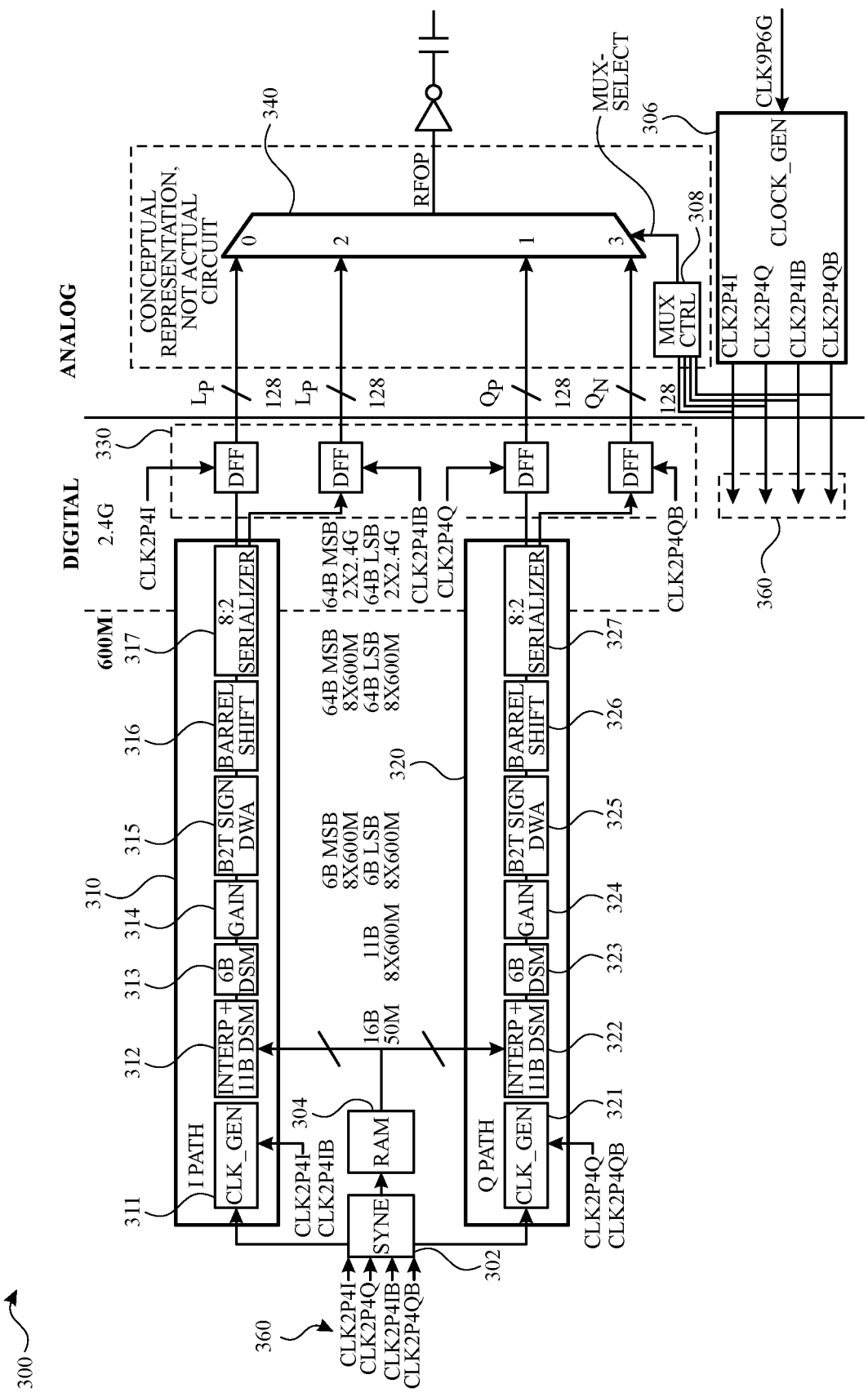
FIG. 3 conceptually illustrates an example of transmitter circuit of wireless communication device in FIG. 2 according to one or more implementations of the subject technology.

FIG. 3 conceptually illustrates an example of transmitter circuit 300 of wireless communication device 200 in FIG. 2 according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The subject technology includes a digital transmitter architecture for wireless communication systems, such as Bluetooth and WiFi. The transmitter circuit 300 includes a synchronization circuit 302, a storage device 304, a clock generation circuit 306, a multiplexer control circuit 308, a first transmitter chain circuit 310, a second transmitter chain circuit 320, output registers 330, and a multiplexer 340. Each of the first transmitter chain circuit 310 and the second transmitter chain circuit 320 includes interpolation to 4.8 GHz (e.g., 312), addition of a 11-bit DSM stage (e.g., 312), and the implementation of all digital blocks at 600 MHz, including a 6-bit DSM (e.g., 313), a barrel shifter (e.g., 316) and a data weighted averaging (DWA) circuit (e.g., 315).

The transmitter circuit 300 has several advantages over traditional transmitter architectures. The transmitter circuit 300 in accordance with one or more implementations of the subject technology provides a higher sample rate compared to traditional transmitters. For example, previous implementations up-sampled the baseband signal to 2.4 GHz, whereas the transmitter circuit 300 can up-sample an incoming RF signal to 4.8 GHz, thus providing better rejection at 2.4 GHz away from the carrier. The transmitter circuit 300 can provide a lower quantization floor compared to prior approaches. For example, previous implementations quantized the signal directly to 11 bits. For low-bandwidth signals such as Bluetooth bit data rates of 1 Mbps, this direct quantization becomes inadequate and introduces correlated quantization noise. In accordance with one or more implementations of the subject technology, the signal is quantized in the transmitter circuit 300 using an 11-bit first-order DSM modulator, producing significant improvement in quantization floor performance. The transmitter circuit 300 provides a parallel implementation compared to serial implementations in prior approaches. For example, previous implementations implemented the final DSM stage and DWA algorithm in analog (as a digital block), running at 2.4 GHz. The transmitter circuit 300, in contrast, implements the entire digital portion at 600 MHz, for example, and adds a serializer stage to generate the final 9.6 GHz signal feeding the DACs. This is a significant architectural contribution for meeting timing and reducing power consumption. In some implementations, the DSM is implemented with a partitioned, parallel architecture. The transmitter circuit 300 in accordance with one or more implementations of the subject technology provides digital compensation of MSB (most-significant-bit)/LSB (least-significant-bit) mismatch. For example, a gain stage is added on a LSB side of the transmitter circuit 300, for example, to compensate for MSB/LSB mismatch between DAC elements. The transmitter circuit 300 in accordance with one or more implementations of the subject technology also provides an architectural innovation. For example, the transmitter circuit 300 is different from existing WLAN implementations in several aspects, including the overall architecture, the number of DAC elements used, and the use of the DSM stages and DWA algorithm.

In some implementations, since the transmitter circuit 300 is wideband in nature, multiple signals can be sent using the same transmitter. In some implementations, the transmitter circuit 300 is a wideband transmitter with a fixed LO. In some aspects, wideband transmitters, such as the transmitter circuit 300, are advantageous for power amplifier pre-distortion applications.

Transmitter circuit 300 can be configured to transmit radio frequency (RF) signals, for example, for use in a mobile device such as a mobile telephone. In the implementation depicted in FIG. 3, note that transmitter circuit 300 can represent a differential transceiver architecture that transmits differential RF signals carrying differential In-phase (I) signals and Quadrature-phase (Q) signals. In this regard, each of the differential I and Q component signals is composed of positive and negative signals (e.g., I+, I−, Q+, Q−). Transmitter circuit 300 can include multiple digital circuits, such as an interpolation chain circuit, a DSM circuit, a digital gain circuit and a DWA circuit, for carrying the differential I and Q signals on separate signal paths. In some aspects, transmitter circuit 300 can represent a single-ended transceiver architecture for carrying single-ended I and Q signals.

For each component signal path, the first transmitter chain circuit 310 includes clock generator 311, interpolation chain circuit 312, DSM circuit 313, digital gain circuit 314, DWA circuit 315, barrel shifter 316, and parallel-to-serial converter 317, and the second transmitter chain circuit 320 includes clock generator 321, interpolation chain circuit 322, DSM circuit 323, digital gain circuit 324, DWA circuit 325, barrel shifter 326, and parallel-to-serial converter 327. Each component signal path leading to the input of the clock generators 311 and 321 may respectively carry baseband frequency signals or intermediate frequency (IF) signals. Each component signal path respectively deriving from the output of the first transmitter chain circuit 310 and the second transmitter chain circuit 320 may carry radio frequency signals. Note that DAC 278, filtering/gain module 280, up-conversion module 282, PA 284 and transmitter filter module 285 included in radio transmitter circuit 299 of FIG. 2 are replaced by the sub-components of the first transmitter chain circuit 310 and the second transmitter chain circuit 320 included in the transmitter circuit 300 of FIG. 3.

Each of the first transmitter chain circuit 310 and the second transmitter chain circuit 320 may be configured to respectively receive the differential I and Q component signals. In addition, each of the first transmitter chain circuit 310 and the second transmitter chain circuit 320 may be configured to receive the same clock signals configured with the same duty cycle (sometimes referred to as a clock phase). For example, the clock generation circuit 306, represented as local oscillation module 274 of FIG. 2, may generate four local oscillator (LO) clock signals (e.g., clk2p4i, clk2p4q, clk2p4ib, clk2p4qb), each delay-shifted by one-fourth of the clock cycle. In some aspects, the number of LO clock signals may be arbitrary depending on implementation. The clock cycle may have a period of about 400 picoseconds to produce a clock frequency of about 2.4 GHz.

The clock generation circuit 306 feeds the LO clock signals (e.g., clk2p4i, clk2p4q, clk2p4ib, clk2p4qb) to the synchronization circuit 302 to establish a synchronized state in each of the component signal paths (e.g., 310, 320) by feeding a synchronization signal to each component signal path. The clock generation circuit 306 also feeds respective LO clock signals to each of the component signal paths. For example, the clock generation circuit 306 feeds a first subset of LO clock signals (e.g., clk2p4i, clk2p4ib) to the first transmitter chain circuit 310, and feeds a second subset of LO clock signals (e.g., clk2p4q, clk2p4qb) to the second transmitter chain circuit 320.

The synchronization circuit 302 also may synchronize the storage device 304 with the synchronization signal. The storage device 304 feeds digital data for transmission as a 16-bit baseband signal to each of the component signal paths. By way of example, the baseband signal may be fed from the storage device 304 at a rate of about 50 MHz, but the rate may vary depending on implementation. In some aspects, the storage device 304 may be a single memory device or multiple memory devices. Such a memory device may be a read-only memory, random access memory, volatile memory, non-volatile memory, static memory, dynamic memory, flash memory, and/or any device that stores digital information. In some aspects, the baseband signal may be fed from a baseband modulator or similar hardware component, and not necessarily a storage device.

The interpolation chain circuit 312 is configured to up-sample the baseband complex signals up to a specified sample frequency (e.g., 4.8 GHz). The interpolation chain circuit 312, for example, resamples the 16-bit baseband signal from a rate of 50 MHz to about 4.8 GHz over a predetermined number of stages. Each stage may include an interpolation filter, such as a finite impulse response (FIR) filter. The sample rate of the interpolation chain circuit 312 is kept at 600 MHz at each stage. In this respect, to meet a throughput of about 4.8 GHz, a predetermined number of complex streams, such as 8 streams, are processed at the sample rate of 600 MHz. In some examples, the complex streams are arranged in parallel to one another, and processed concurrently through the interpolation chain circuit 312. The interpolated signal produced by the interpolation chain circuit 312 is quantized from 16 bits to 11 bits with a first-order DSM. In each component signal path, the respective interpolation chain circuit (e.g., 312, 322) then passes 8 streams to the respective DSM circuit (e.g., 313, 323) at a rate of 600 MHz, each stream of 11 bits.

The 11-bit output from the DSM block in the interpolation chain circuit (e.g., 312, 322) is separated into MSBs and LSBs using a 6-bit DSM block (e.g., 313, 323). For example, each stream containing the 11-bit baseband signal is subsequently divided into separate bitwidth signal paths (not shown) respectively having a first order of bits (e.g., 6 MSBs) and a second order of bits (e.g., 6 LSBs) using another first-order DSM (e.g., 313). In some aspects, the MSB signal path is padded with 1 bit to form a total number of 6 bits. Although a first-order DSM is depicted in each instance of FIG. 3, the DSM can be of any arbitrary order (e.g., L>0) depending on implementation. In each component signal path, the respective DSM circuit (e.g., 313, 323) then passes 16 streams (8 MSB streams and 8 LSB streams) to the respective digital gain circuit (e.g., 314, 324) at a rate of 600 MHz, each stream of 6 bits.

For each stream in the I component signal path (e.g., 310), the LSB signal path is scaled by the digital gain circuit 314 to compensate for any MSB/LSB mismatch at the DAC elements (e.g., 278). Similarly, for each stream in the Q component signal path (e.g., 320), the LSB signal path is scaled by the digital gain circuit 324 to compensate for any MSB/LSB DAC mismatch. In each component signal path, the respective digital gain circuit (e.g., 314, 324) then passes the 16 streams to the respective DWA circuit (e.g., 315, 325) at a rate of 600 MHz, each stream of 6 bits. The digital gain circuits 314, 324 may include a multiplier to perform the gain operation of the input stream in some implementations, or may include a multiplexer with shifting in other implementations.

In each of the component signal paths (e.g., 310, 320), the MSB and LSB signal paths are further divided into even and odd samples. In some implementations, the DWA circuit 315 includes logic circuitry to perform a sign operation, such as negation. In this respect, the even samples are passed through and odd samples are negated. This has the effect of up-converting the baseband signal to a rate of 2.4 GHz.

In some implementations, the DWA circuit 315 includes logic circuitry to perform thermometer conversion. For example, the MSB and LSB signal paths of each stream are converted from binary to thermometer (e.g., 64 bits for each bitwidth signal path). After applying the sign operation, the signals pass through a binary-to-thermometer conversion, and the thermometer data is circularly shifted using a logarithmic shifter. In the DWA circuit 315, the shift is computed using a bandpass DWA algorithm. In some implementations, the DWA algorithm is employed to randomize the use of different DAC elements. In each component signal path, the respective DWA circuit (e.g., 315, 325) then passes the 16 streams to the respective barrel shifter (e.g., 316, 326) at a rate of 600 MHz, each stream of 64 bits. In some implementations, the barrel shifter (e.g., 316, 326) is part of the corresponding DWA circuit (e.g., 315, 325).

The barrel shifters 316, 326 can respectively shift the input stream by an arbitrary amount of bit positions, depending on implementation. In each component signal path, the respective barrel shifter (e.g., 316, 326) then passes the 16 barrel-shifted streams to the respective parallel-to-serial converter (e.g., 317, 327) at a rate of 600 MHz, each stream of 64 bits.

In some aspects, the two final parallel-to-serial converters (e.g., 317, 327) generate the required 9.6 GHz signal to feed to the DAC elements. For example, 8:2 serializers are used in each component signal path to convert the sixteen 600 MHz streams across the two component signal paths to four 2.4 GHz streams, each stream of 128 bits. In some aspects, each of the four streams represents an I/Q signal component (e.g., I positive, I negative, Q positive, Q negative).

In some implementations, the output signals from each of the parallel-to-serial converters 317, 327 is registered with one of the output registers 330. For example, in each component signal path, the respective parallel-to-serial converter (e.g., 317, 327) passes 2 streams to the respective output register (e.g., 330) at a rate of 2.4 GHz, each stream of 64 bits. The output registers 330 are respectively clocked by one of the LO clock signals (e.g., clk2p4i, clk2p4q, clk2p4ib, clk2p4qb). In some aspects, the output registers 330 include D-type flip flops ("DFF"), but may be of any other type of flip flop depending on implementation. Each of the output registers (e.g., 330) clocks the input signal according to the respective clock signal to produce a bit stream of 128 bits at its output. In some implementations, the 64 MSBs of the 128-bit stream feed the 64 MSB DAC elements, whereas the 64 LSBs of the 128-bit stream feed the 64 LSB DAC elements. The boundary between the digital domain and the analog domain may be defined between the output registers 330 and the multiplexer 340 in some implementations, or defined between the DAC elements and the multiplexer 340. In some aspects, the multiplexer 340 may be referred to as a serializer.

In some aspects, the output of each the DAC elements (not shown) may be coupled to an input of the multiplexer 340. In this respect, these four 128-bit streams are sent to the analog domain, where the multiplexer 340 converts the streams to a single 128-bit stream at a rate of about 9.6 GHz. The output of the multiplexer 340 is then fed to the antenna via an LC network (not shown). The multiplexer 340 is controlled by the multiplexer control circuit 308. The multiplexer control circuit 308 receives the LO clock signals as input from the clock generation circuit 306, and generates a mux control signal to select one of the multiplexer inputs to send to the output. By way of example, the I positive signal path is selected first (denoted by "0"), the Q positive signal path is selected second (denoted by "1"), the I negative signal path is selected third (denoted by "2"), and the Q negative signal path is selected last (denoted by "3"), however, the ordering of selection can vary depending on implementation.

Depending on implementation, clock generator 311, interpolation chain circuit 312, DSM 313, digital gain 314, DWA 315, barrel shifter 316, and parallel-to-serial converter 317 included in the first transmission circuit 310 may be integrated onto a single chip or die. Similarly, clock generator 321, interpolation chain circuit 322, DSM 323, digital gain 324, DWA 325, barrel shifter 326, and parallel-to-serial converter 327 included in the second transmission circuit 320 may be integrated onto a single chip or die. In some aspects, the first transmission circuit 310 and the second transmission circuit 320 may be integrated onto a single chip or die. The integrated components can be implemented using system-on-chip (SOC) and configured to provide a standardized PAD output, for example, to enable the interchangeability with off-chip components (e.g., antenna).

Figure 4:
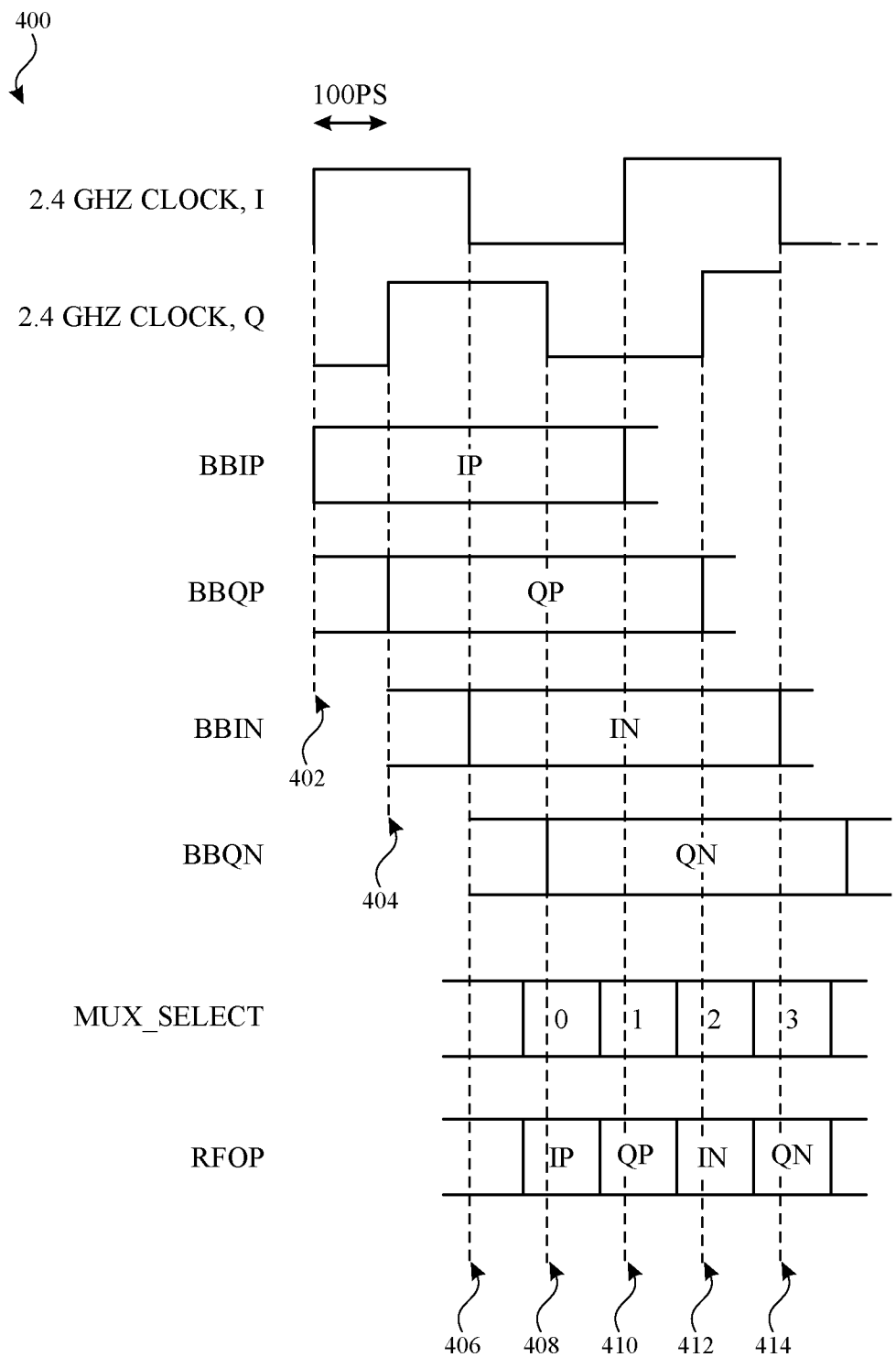
FIG. 4 illustrates a timing diagram associated with the transmitter circuit of FIG. 3 according to one or more implementations of the subject technology.

FIG. 4 illustrates a timing diagram 400 associated with the transmitter circuit 300 of FIG. 3 according to one or more implementations of the subject technology. The timing diagram 400 includes waveforms of local oscillation clock signals generated by a clock generator, such as the clock generation circuit 306 of FIG. 3. In one or more implementations, the local oscillation module 274 is, or includes, the clock generation circuit 306. Each LO clock signal waveform is shifted in phase and each corresponds to a respective phase in the clock cycle. By way of example, if the clock cycle includes four clock phases, then each waveform is shifted in phase by 25% (or one-fourth of the clock cycle). Conversely, the number of LO clock signals is equivalent to the number of phases in the clock cycle. As such, a four-phase clock cycle would include four LO clock signals, each having a duty cycle that is one-fourth of the clock cycle.

In one or more aspects, the output registers 330 include individual registers that enable full utilization of the clock cycle. That is, the I and Q component signals pass through the individual output registers 330 during each phase of the clock cycle. By way of example, four individual registers may be connected with differential I and Q component signals such that a first register outputs a 128-bit I positive component signal ("bbip") during a first phase of the clock cycle (or at rising edge of 2.4 GHz clock, i) at time 402, a second register outputs a 128-bit Q positive component signal ("bbqp") during a second phase of the clock cycle (or at rising edge of 2.4 GHz clock, q) at time 404, a third register outputs a 128-bit I negative component signal ("bbin") during a third phase of the clock cycle (or at falling edge of 2.4 GHz clock, i) at time 406, and a fourth register outputs a 128-bit Q negative component signal ("bbqn") during a fourth phase of the clock cycle (or at falling edge of 2.4 GHz clock, q) at time 408. In this respect, the multiplexer 340 selects each component signal to be available for transmission during each phase of the clock cycle. For example, at time 408, the 128-bit I positive component signal ("bbip") is selected for output when multiplexer control signal ("mux_select") is 0. At time 410, the 128-bit Q positive component signal ("bbqp") is selected for output when mux_select is 1. At time 412, the 128-bit I negative component signal ("bbin") is selected for output when mux_select is 2. At time 414, the 128-bit Q negative component signal ("bbqn") is selected for output when mux_select is 3.

Figure 5:
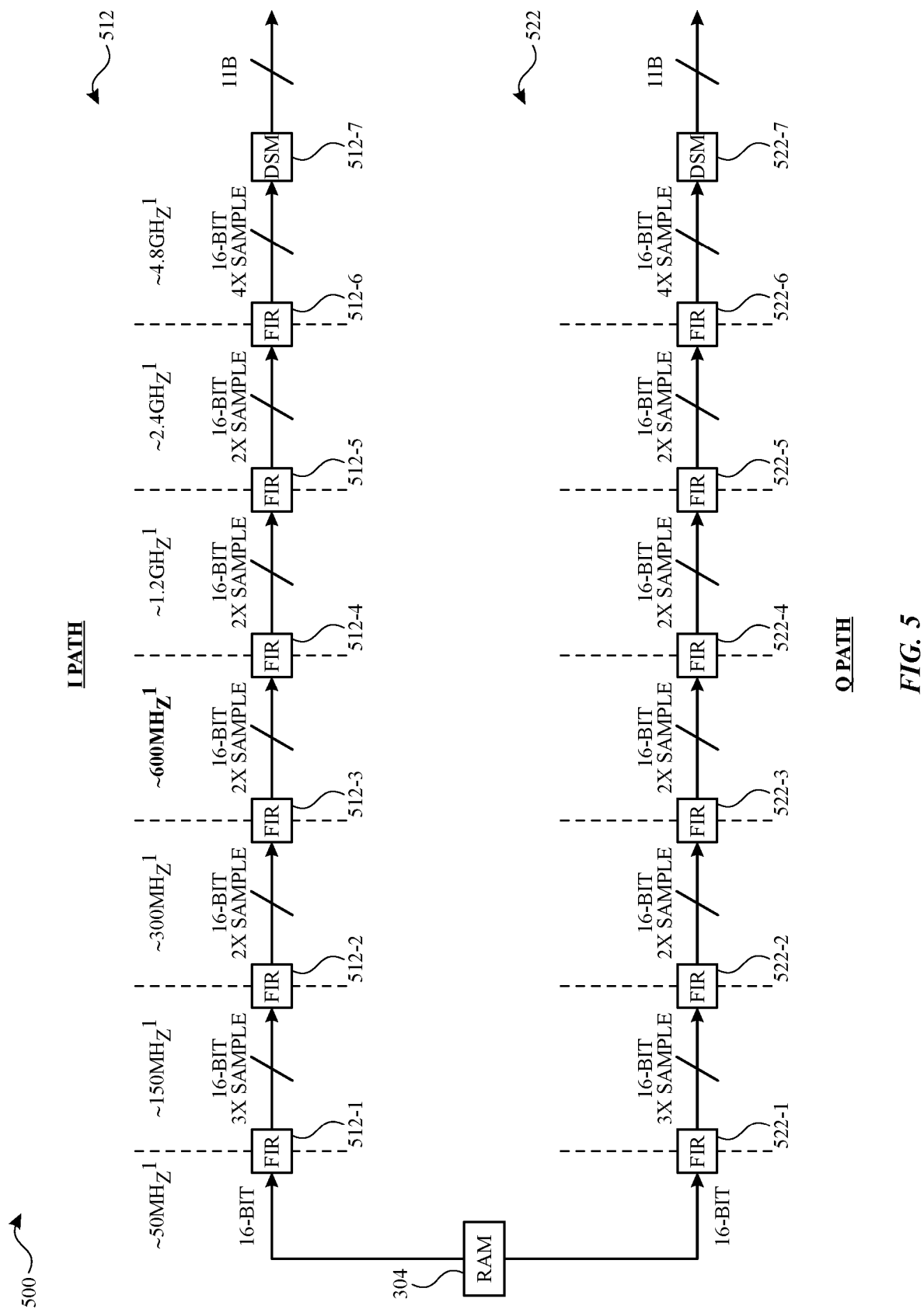
FIG. 5 conceptually illustrates an example of an interpolation chain in each component signal path of FIG. 3 according to one or more implementations of the subject technology.

FIG. 5 conceptually illustrates an example of an interpolation chain 500 in each component signal path of FIG. 3 according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

As depicted in FIG. 5, the interpolation chain 500 is, or includes, the interpolation chain circuit 312. In the first component signal path, such as the I path, a first interpolation chain 512 includes first interpolation filter circuits 512-1, 512-2, 512-3, 512-4, 512-5, 512-6 connected in series, and followed by a first-order DSM circuit 512-7 connected in series with the first interpolation filter circuits. In the second component signal path, such as the Q path, a second interpolation chain 522 includes second interpolation filter circuits 522-1, 522-2, 522-3, 522-4, 522-5, 522-6, and followed by a first-order DSM circuit 522-7 connected in series with the second interpolation filter circuits.

As discussed above, the storage device 504 (or baseband modulator) feeds digital data for transmission as a 16-bit baseband signal to each of the component signal paths. The 16-bit baseband signal is first fed to the interpolation filter circuit 512-1 ("AAIF1") and the interpolation filter circuit 522-1 ("AAIF1"), on the respective component signal paths. The interpolation filter circuit 512-1 and the interpolation filter circuit 522-1 are each represented as a 13th-order FIR filter, where the input signal is up-sampled three times to convert the rate from 50 MHz to 150 MHz.

The 16-bit baseband signal is next fed to the interpolation filter circuit 512-2 ("AAIF2") and the interpolation filter circuit 522-2 ("AAIF2"), on the respective component signal paths. The interpolation filter circuit 512-2 and the interpolation filter circuit 522-2 are each represented as a 4th-order FIR filter, where the input signal is up-sampled twice to convert the rate from 150 MHz to 300 MHz.

The 16-bit baseband signal is subsequently fed to the interpolation filter circuit 512-3 ("AAIF3") and the interpolation filter circuit 522-3 ("AAIF3"), on the respective component signal paths. The interpolation filter circuit 512-3 and the interpolation filter circuit 522-3 are each represented as a 3rd-order FIR filter, where the input signal is up-sampled twice to convert the rate from 300 MHz to 600 MHz.

The 16-bit baseband signal is next fed to the interpolation filter circuit 512-4 ("AAIF4") and the interpolation filter circuit 522-4 ("AAIF4"), on the respective component signal paths. The interpolation filter circuit 512-4 and the interpolation filter circuit 522-4 are each represented as a 3rd-order FIR filter, where the input signal is up-sampled twice to convert the rate from 600 MHz to 1.2 GHz.

The 16-bit baseband signal is subsequently fed to the interpolation filter circuit 512-5 ("AAIF5") and the interpolation filter circuit 522-5 ("AAIF5"), on the respective component signal paths. The interpolation filter circuit 512-5 and the interpolation filter circuit 522-5 are each represented as a 2nd-order FIR filter, where the input signal is up-sampled twice to convert the rate from 1.2 GHz to 2.4 GHz.

The 16-bit baseband signal is next fed to the interpolation filter circuit 512-6 ("AAIF6") and the interpolation filter circuit 522-6 ("AAIF6"), on the respective component signal paths. The interpolation filter circuit 512-6 and the interpolation filter circuit 522-6 are each represented as a 2nd-order FIR filter, where the input signal is up-sampled twice to convert the rate from 2.4 GHz to 4.8 GHz.

In each of the component signal paths of the interpolation chain 500, the interpolated baseband signal is passed through an 11-bit DSM block to quantize the high-resolution 16-bit baseband signal down to 11 bits. As depicted in FIG. 5, the first-order DSM circuit 512-7 and the first-order DSM circuit 522-7 each receive the up-sampled signal from the interpolation filter circuit 512-6 and the interpolation filter circuit 522-6, respectively.

Figure 6:
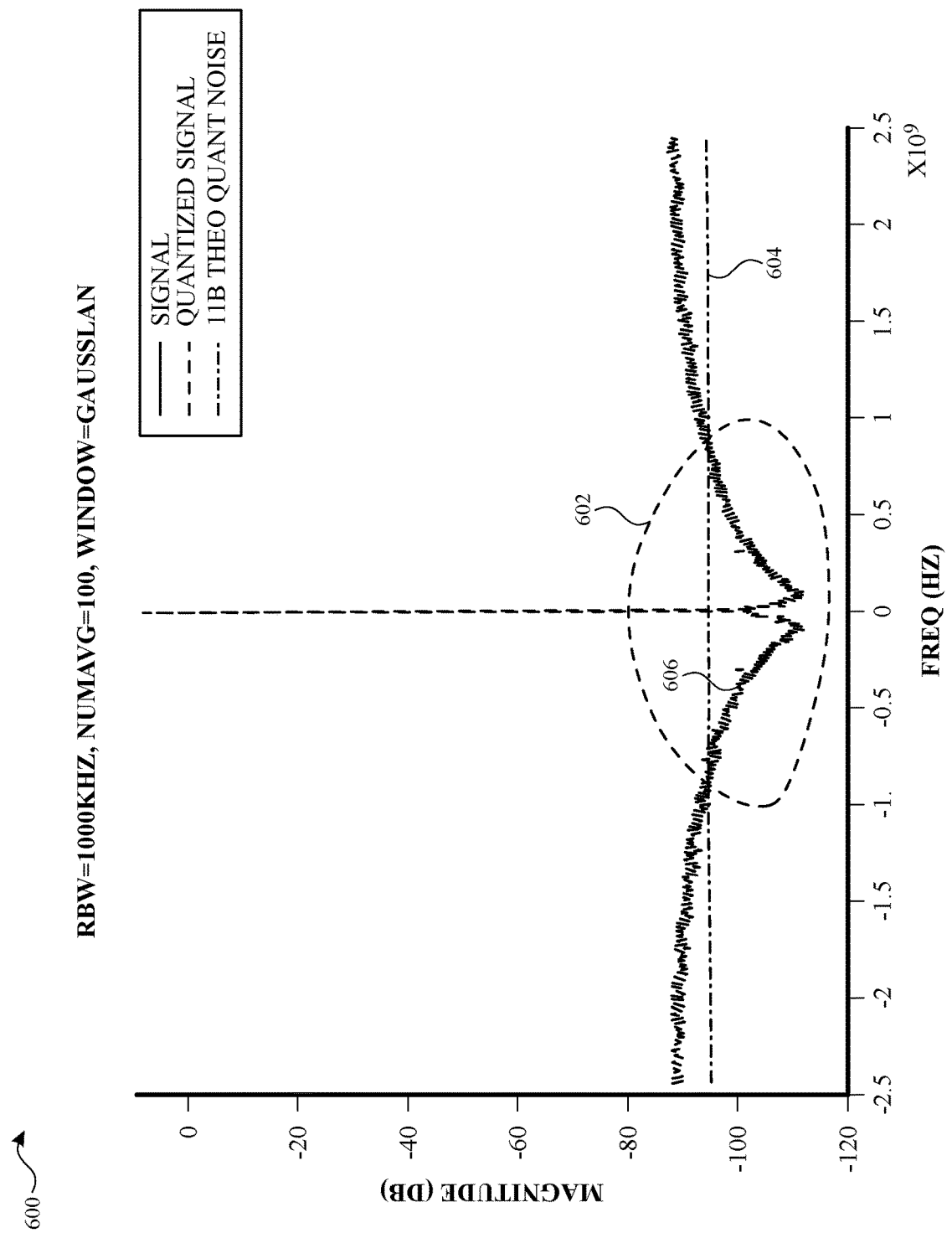
FIG. 6 illustrates a plot depicting a baseband signal waveform with quantization noise using delta-sigma modulation (DSM) quantization according to one or more implementations of the subject technology.

FIG. 6 illustrates a plot 600 depicting a baseband signal waveform 606, where an 11-bit DSM stage is added to the quantization. As illustrated in plot 600, the baseband signal waveform 606 has lesser quantization noise measurements above a predetermined noise threshold 604 in a region of interest 602 compared to measurements not including the DSM stage, thus showing the benefit of adding the 11-bit DSM stage.

Figure 7A:
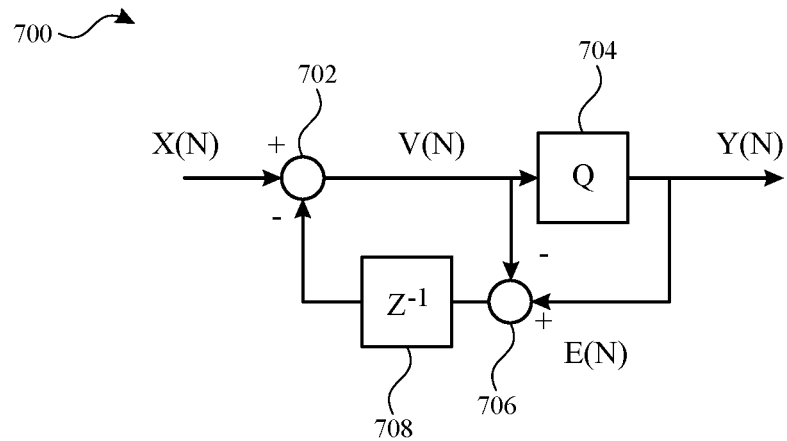
FIG. 7A illustrates a schematic diagram of a digital circuit realization of a traditional first-order DSM.

FIG. 7A illustrates a schematic diagram of a digital circuit realization of a traditional first-order DSM 700. The first-order DSM 700 includes adders 702 and 706, quantizer 704 ("Q"), and a first-order feedback loop filter 708 ("$Z^{-1}$"). The input x(n) is fed to the adder 702. The output of the adder 702 produces an adder signal v(n), which represents the difference between the input x(n) and a loop filter error signal from the feedback loop filter 708. The adder signal v(n) is fed to the quantizer 704 and to the adder 706. The quantizer 704 produces an output signal y(n), and provides an error signal e(n) stemming from the output signal y(n) on a feedback signal path to the adder 706. The adder 706 produces an error feedback signal to the feedback loop filter 708, which represents the difference between the error signal e(n) and the adder signal v(n). In some implementations, the first-order DSM 700 is configured to operate at a rate of 4.8 GHz.

As such, the first-order DSM 700 can be expressed as:

$$y(n)=Q[x(n)-e(n-1)] \quad \text{Eq. (1)}$$

In order to meet timing, a design would have to close timing through the input adder (e.g., 702), through the quantizer (e.g., 704), and through the error adder (e.g., 706).

With new designs running at 5 GHz, implementing these modulators with the prior solutions, such as that shown in FIG. 7A, at a such high rate may be impractical, including 7 nm libraries. When attempting to run at 4.8 GHz, designs have either failed timing, or required custom designs which are time consuming and prone to error. Using regular standard cells and digital tools, it would be nearly impossible to meet timing even for a simple adder at these speeds. Larger cells would need to be inserted, at the expense of both area and power. An alternative is to do a custom (manual) layout, which would require a significant amount of time from designers, consume significant amount of power, and would be prone to human error. The subject technology addresses this issue and provides novel architectures for implementing high-speed DSMs using standard-cell libraries.

In accordance with one or more implementations of the subject technology, partitioning of a DSM is achieved with two novel techniques: 1) a parallel DSM architecture, where the DSM is implemented as multiple parallel stages, each feeding an error to the subsequent stage; and 2) a partitioned DSM architecture, where each parallel stage is partitioned into MSBs and LSBs, further simplifying each stage to meet timing. Similar techniques can be applied to other high-speed digital blocks with feedback. Any wireless device for a wireless communication application can benefit from the subject technology, as long as it requires a high-speed DSM. Examples of such applications are fully-digital transmitters for Bluetooth and WLAN applications.

Figure 7B:
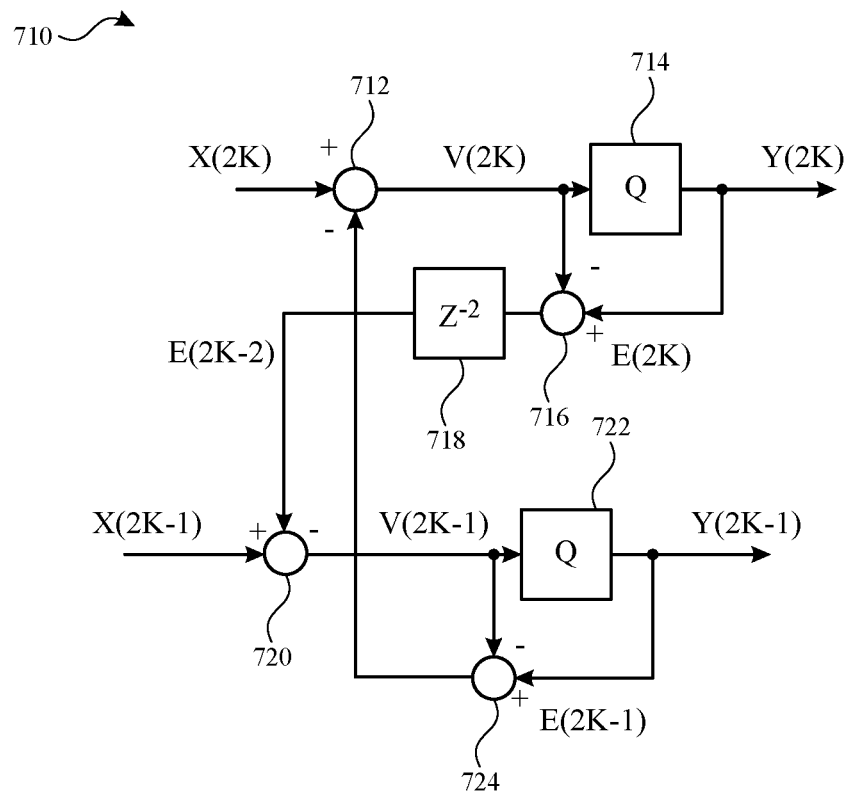
FIG. 7B illustrates a schematic diagram of a digital circuit realization of a parallel architecture of a DSM.

FIG. 7B illustrates a schematic diagram of a digital circuit realization of a parallel architecture of a DSM 710. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

As illustrated in FIG. 7B, the DSM 710 is partitioned into parallel blocks. The first-order DSM 750 includes adders 712, 716, 720 and 724, quantizers 714 and 722 ("Q"), and a second-order feedback loop filter 718 ("$Z^{-2}$"). A first input x(2k) is fed to the adder 712, and a second input x(2k−1) is fed to the adder 720. The output of the adder 702 produces a first adder signal v(2k), which represents the difference between the input x(2k) and a second error feedback signal e(2k−1) from the adder 724. The first adder signal v(2k) is fed to the quantizer 714 and to the adder 716. The quantizer 714 produces an output signal y(2k), and provides an error signal e(2k) stemming from the output signal y(2k) on a feedback signal path to the adder 716. The adder 716 produces a first error feedback signal to the feedback loop filter 718, which represents the difference between the error signal e(2k) and the first adder signal v(2k). The adder 720 produces a second adder signal v(2k−1), which represents the difference between the second input x(2k−1) and a loop filter error signal from the feedback loop filter 718. The second adder signal v(2k−1) is fed to the quantizer 722 and to the adder 724. The quantizer 722 produces an output signal y(2k−1), and provides an error signal e(2k−1) stemming from the output signal y(2k−1) on a feedback signal path to the adder 724. The adder 724 produces the second error feedback signal e(2k−1), which represents the difference between the second adder signal v(2k−1) and the error signal e(2k−1).

As such, the DSM 710 can be expressed as:

$$y(2k)=Q[x(2k)-e(2k-1)] \quad \text{Eq. (2)}$$

$$y(2k-1)=Q[x(2k-1)-e(2k-2)] \quad \text{Eq. (3)}$$

At time n=2k, the terms x(2k), x(2k−1) and e(2k−2) are known. Using the second equation (e.g., Eq. (2)), the terms y(2k−1) and e(2k−1) can be computed to equate the terms: y(2k−1)−x(2k−1)+e(2k−2). Then, the term e(2k−1) can be used to compute the term y(2k).

In some implementations, a parallel DSM architecture running at half the rate can be implemented as shown in FIG. 7B. In some aspects, every delay in the parallel DSM architecture of FIG. 7B has been replaced by two delays (or equivalent to a single delay at half the rate). In some implementations, a single multiplexer may be connected at the output to serialize the output to a single stream y(n). Additional delays can be inserted at the output to pipeline such operation.

Figure 7C:
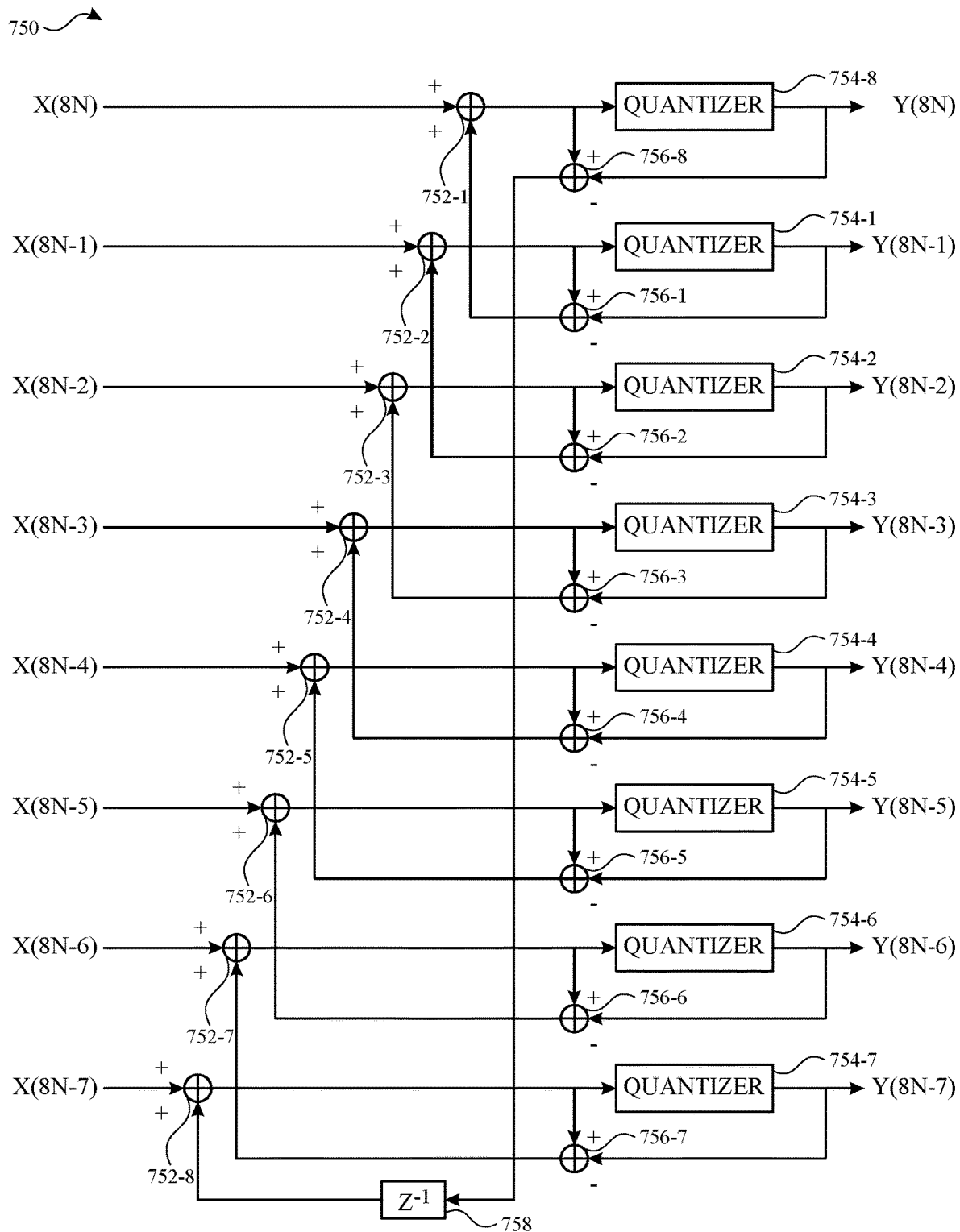
FIG. 7C illustrates a schematic diagram of a digital circuit realization of a multi-stage parallel architecture of a DSM.

FIG. 7C illustrates a schematic diagram of a digital circuit realization of a multi-stage parallel architecture of a DSM 750. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Using the same architecture described in FIG. 7B as a building block, a parallel DSM implementation can be extended to 3, 4, 5, or any arbitrary number of parallel streams. For example, FIG. 7C shows an 8-stage parallel implementation of the same DSM as that shown in FIG. 7B. The DSM 750 includes an architecture for a digital DSM with arbitrary order (e.g., L>0) and number of bits, suitable for very high speed implementations. Earlier solutions for high speed DSMs were implemented at a nominal sample rate, e.g., 2.4 GHz. In contrast, the DSM 750 of FIG. 7C running at 4.8 GHz can be partitioned, using the techniques described herein, into 8 DSM blocks running at 600 MHz. At the expense of area, the parallel DSM architecture meets timing, and reduces power consumption.

The DSM 750 includes input adders 752-1, 752-2, 752-3, 752-4, 752-5, 752-6, 752-7, and 752-8, quantizers 754-1, 754-2, 754-3, 754-4, 754-5, 754-6, 754-7, and 754-8, error adders 756-1, 756-2, 756-3, 756-4, 756-5, 756-6, 756-7, and 756-8, and first-order feedback loop filter 758. In a first stage of the DSM 750, the first input x(8n) is fed to the input adder 752-1. The first adder 752-1 feeds the quantizer 754-8, which produces a first output signal y(8n). The quantizer 754-8 provides a first feedback error signal stemming from the output signal to the error adder 756-8. The error adder 756-8 produces a first adder error signal, which represents the difference between the first feedback error signal and adder signal from the adder 752-1. This adder error signal from the error adder 756-8 is then fed to the feedback loop filter 758. The feedback loop filter 758 then feeds the input adder 752-8 with a feedback loop filter signal.

In a second stage of the DSM 750, the second input x(8n−1) is fed to the input adder 752-2. The adder 752-2 feeds the quantizer 754-1, which produces a second output signal y(8n−1). The quantizer 754-1 provides a second feedback error signal stemming from the output signal to the error adder 756-1. The error adder 756-1 produces a second adder error signal, which represents the difference between the second feedback error signal and adder signal from the adder 752-2. This adder error signal from the error adder 756-1 is then fed to the input adder 752-1.

In a third stage of the DSM 750, the third input x(8n−2) is fed to the input adder 752-3. The adder 752-3 feeds the quantizer 754-2, which produces a third output signal y(8n−2). The quantizer 754-2 provides a third feedback error signal stemming from the output signal to the error adder 756-2. The error adder 756-2 produces a third adder error signal, which represents the difference between the third feedback error signal and adder signal from the adder 752-3. This adder error signal from the error adder 756-2 is then fed to the input adder 752-2.

In a fourth stage of the DSM 750, the fourth input x(8n−3) is fed to the input adder 752-4. The adder 752-4 feeds the quantizer 754-3, which produces a fourth output signal y(8n−3). The quantizer 754-3 provides a fourth feedback error signal stemming from the output signal to the error adder 756-3. The error adder 756-3 produces a fourth adder error signal, which represents the difference between the fourth feedback error signal and adder signal from the adder 752-4. This adder error signal from the error adder 756-3 is then fed to the input adder 752-3.

In a fifth stage of the DSM 750, the fifth input x(8n−4) is fed to the input adder 752-5. The adder 752-5 feeds the quantizer 754-4, which produces a fifth output signal y(8n−4). The quantizer 754-4 provides a fifth feedback error signal stemming from the output signal to the error adder 756-4. The error adder 756-4 produces a fifth adder error signal, which represents the difference between the fifth feedback error signal and adder signal from the adder 752-5. This adder error signal from the error adder 756-4 is then fed to the input adder 752-4.

In a sixth stage of the DSM 750, the sixth input x(8n−5) is fed to the input adder 752-6. The adder 752-6 feeds the quantizer 754-5, which produces a sixth output signal y(8n−5). The quantizer 754-5 provides a sixth feedback error signal stemming from the output signal to the error adder 756-5. The error adder 756-5 produces a sixth adder error signal, which represents the difference between the sixth feedback error signal and adder signal from the adder 752-6. This adder error signal from the error adder 756-5 is then fed to the input adder 752-5.

In a seventh stage of the DSM 750, the seventh input x(8n−6) is fed to the input adder 752-7. The adder 752-7 feeds the quantizer 754-6, which produces a seventh output signal y(8n−6). The quantizer 754-6 provides a seventh feedback error signal stemming from the output signal to the error adder 756-6. The error adder 756-6 produces a seventh adder error signal, which represents the difference between the seventh feedback error signal and adder signal from the adder 752-7. This adder error signal from the error adder 756-6 is then fed to the input adder 752-6.

In an eighth stage of the DSM 750, the eighth input x(8n−7) is fed to the input adder 752-8. The adder 752-8 feeds the quantizer 754-7, which produces an eighth output signal y(8n−7). The quantizer 754-7 provides an eighth feedback error signal stemming from the output signal to the error adder 756-7. The error adder 756-7 produces an eighth adder error signal, which represents the difference between the eighth feedback error signal and adder signal from the adder 752-8. This adder error signal from the error adder 756-7 is then fed to the input adder 752-7.

In some implementations, each parallel stage of the DSM 750 is represented as a 1st order DSM configured to run at a rate of 600 MHz. In this respect, the DSM 750 having multiple data lines (e.g., 8×) are processed by the parallel architecture in order to have an effective sampling rate of 4.8 GHz. For example, the output of the 8 DSM stages can then be multiplexed to produce a 4.8 GHz output. In some aspects, the partitioned DSM as shown in FIG. 7C is mathematically equivalent to the original DSM (e.g., 720 of FIG. 7B) running at 4.8 GHz, where given the same input, the multi-stage parallel DSM 730 can provide the same output with a fixed delay.

Figure 7D:
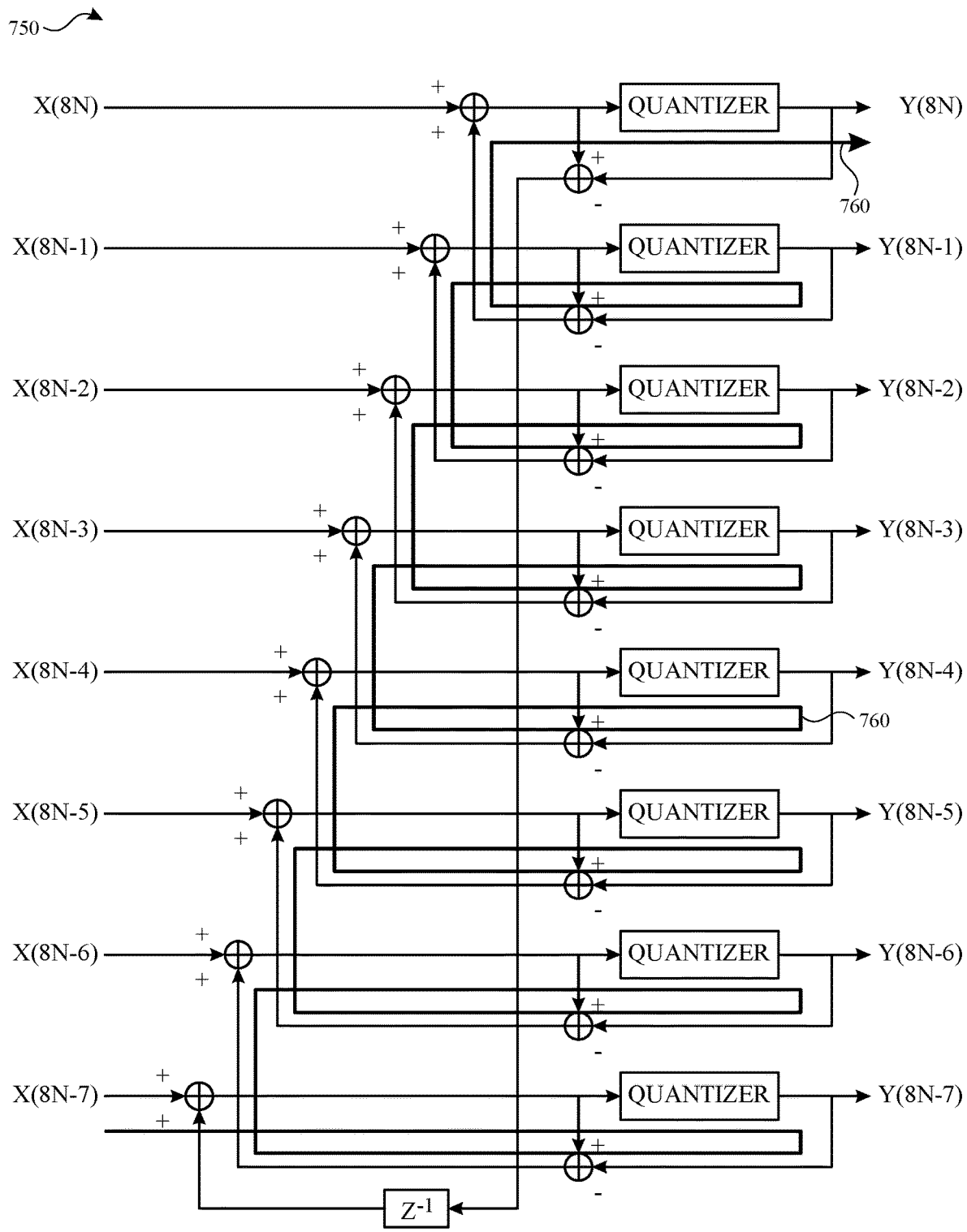
FIG. 7D illustrates an example of a critical path in the multi-stage parallel DSM architecture shown in FIG. 7C according to one or more implementations of the subject technology.

FIG. 7D illustrates an example of a critical path 760 in the multi-stage parallel DSM architecture 750 shown in FIG. 7C according to one or more implementations of the subject technology. In some aspects, the critical path 760 is proportional to the number of parallel paths. As depicted in FIG. 7D, the critical path 760 for the DSM 750 traverses 8 parallel sections.

Figure 8A:
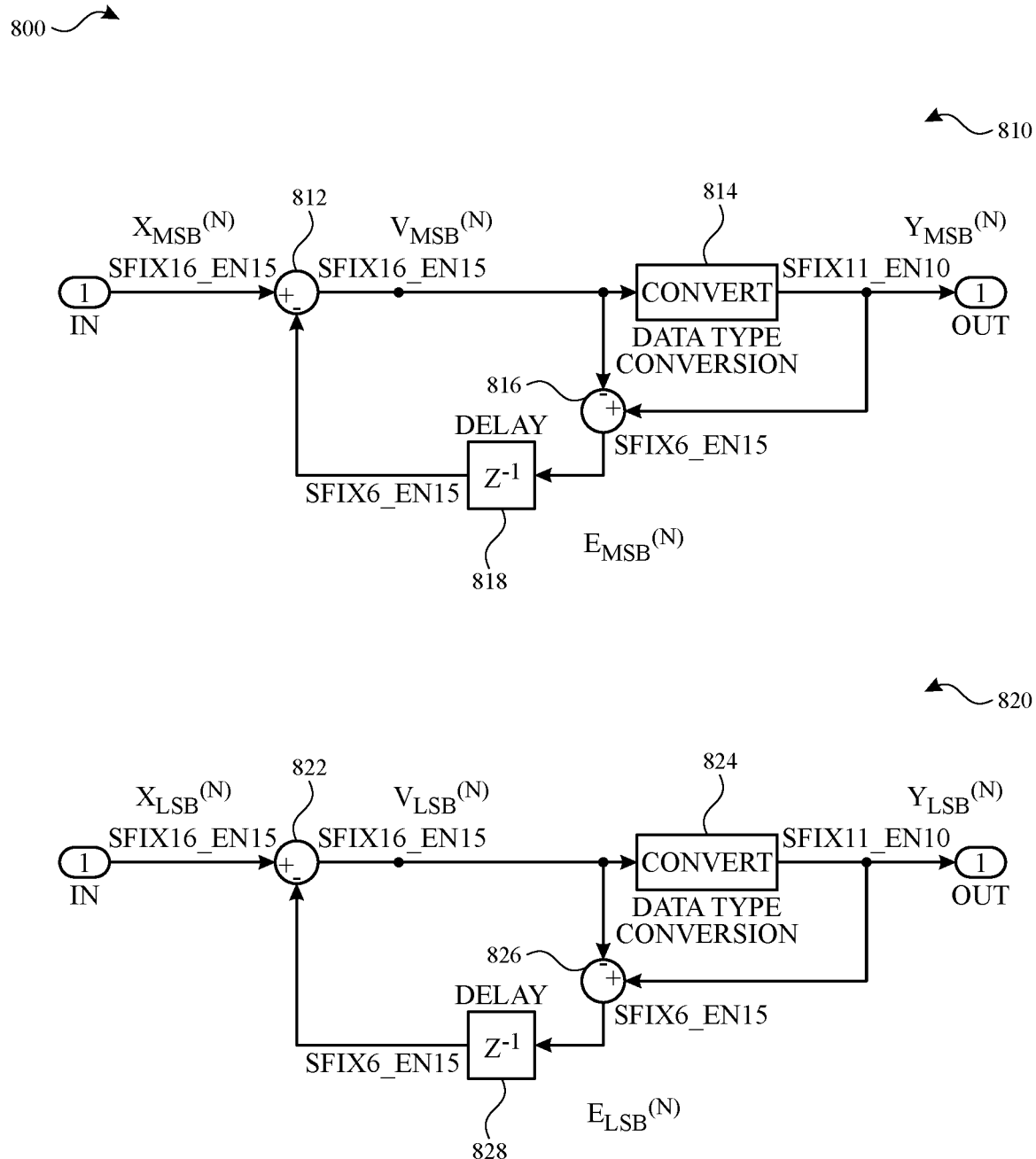
FIG. 8A illustrates an example of a DSM partitioned into MSB and LSB paths according to one or more implementations of the subject technology.

FIG. 8A illustrates a schematic diagram of an example of a DSM 800 partitioned into MSB and LSB paths according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In some implementations, the DSM 800 is partitioned, which splits the DSM parallel architecture into MSBs and LSBs, thus reducing the latency of the critical path 960 (as shown in FIG. 9D) significantly. The DSM 800 includes an MSB signal path 810 and a LSB signal path 820. The MSB signal path 810 includes adders 812 and 816, quantizer 814 ("Q"), and a delay 818 ("$Z^{-1}$"). The MSB input $X_{MSB}(n)$ is fed to the adder 812. The output of the adder 812 produces an adder signal $V_{MSB}(n)$, which represents the difference between the input $X_{MSB}(n)$ and a loop filter error signal from the delay 818. The adder signal $V_{MSB}(n)$ is fed to the quantizer 814 and to the adder 816. The quantizer 814 produces an output signal $Y_{MSB}(n)$, and provides an error signal e(n) stemming from the output signal $Y_{MSB}(n)$ on a feedback signal path to the adder 816. The adder 816 produces an error feedback signal to the delay 818, which represents the difference between the error signal e(n) and the adder signal $V_{MSB}(n)$.

The LSB signal path 820 includes adders 822 and 826, quantizer 824 ("Q"), and a delay 828 ("$Z^{-1}$"). The LSB input $X_{LSB}(n)$ is fed to the adder 822. The output of the adder 822 produces an adder signal $V_{LSB}(n)$, which represents the difference between the input $X_{LSB}(n)$ and a loop filter error signal from the delay 828. The adder signal $V_{LSB}(n)$ is fed to the quantizer 824 and to the adder 826. The quantizer 824 produces an output signal $Y_{LSB}(n)$, and provides an error signal e(n) stemming from the output signal $Y_{LSB}(n)$ on a feedback signal path to the adder 826. The adder 826 produces an error feedback signal to the delay 828, which represents the difference between the error signal e(n) and the adder signal $V_{LSB}(n)$.

In some implementations, each of the inputs (e.g., $X_{MSB}$, $X_{LSB}$) is bounded by $1-2^{-10}$ to avoid DSM overload. The bidwidth of the adder signal v(n) (e.g., $V_{MSB}$, $V_{LSB}$) can be determined using argument by induction, where $|v(n-1)| \le 1 - 2^{-11}$ when v(0)=x(0).

Since, $$v(n)=x(n)-e(n-1)=x(n)+v(n-1)-Q[v(n-1)] \quad \text{Eq. (4)}$$

Then, $$|v(n)| \le |x(n)| + |v(n-1)-Q[v(n-1)]| \le 1-2^{-10}+2-11 \le 1-2^{-11} \quad \text{Eq. (5)}$$

In this respect, v(n) should have same the bitwidth as x(n). In some aspects, the bitwidth of e(n) can be expressed as:

$$|e(n)|=|v(n-1)-Q[v(n-1)]| \le 2-11 \quad \text{Eq. (6)}$$

In this respect, the error signal e(n) can use 6 bits that represent numbers in a range of $-32*2^{-15}$ to $31*2^{-15}$.

As depicted in FIG. 8A, the input is partitioned into MSB[15:5] and LSB[4:0], which can be expressed as:

$$x(n)=xMSB(n)+xLSB(n) \quad \text{Eq. (7)}$$

The output of the partitioned DSM can be expressed as:

$$y(n)=yMSB(n)+yLSB(n) \quad \text{Eq. (8)}$$

At time zero, e(n)=0, so $$v(0)=x(0)=vMSB(0)+vLSB(0) \quad \text{Eq. (9)}$$

In some aspects, the adder signal of a prior stage can be expressed as:

$$v(n-1)=vMSB(n-1)+vLSB(n-1) \quad \text{Eq. (10)}$$

Then, $$vMSB(n)=xMSB(n)+vMSB(n-1)-Q[vMSB(n-1)] \quad \text{Eq. (11)}$$

$$vMSB(n)+vLSB(n)=x(n)+v(n-1)-Q[vMSB(n-1)]-Q[vLSB(n-1)] \quad \text{Eq. (12)}$$

In some aspects, the MSB and LSB quantization can be expressed as:

$$Q[vMSB(n)]+Q[vLSB(n)]=Q[vMSB(n)+vLSB(n)] \quad \text{Eq. (13)}$$

But eMSB(n)=0, Q[vMSB(n)]=vMSB(n)=xMSB(n), and $2^{10}$ vMSB(n) is an integer. Then, $$Q[vMSB(n)+vLSB(n)]=2^{-10}\text{floor}[0.5+2^{10}vMSB(n)+2^{10}vLSB(n)] \quad \text{Eq. (14)}$$

$$=vMSB(n)+2^{-10}\text{floor}[0.5+2^{10}vLSB(n)]=vMSB(n)+Q[vLSB(n)] \quad \text{Eq. (15)}$$

Then, $$v(n)=vMSB(n)+vLSB(n) \quad \text{Eq. (16)}$$

Also, $$eMSB(n)+eLSB(n)=Q[vMSB(n)]+Q[vLSB(n)]-(vMSB(n)+vLSB(n))=Q[v(n)]-v(n)=e(n) \quad \text{Eq. (17)}$$

And therefore, $$yMSB(n)+yLSB(n)=Q[vMSB(n)]+Q[vLSB(n)]=Q[v(n)]=y(n) \quad \text{Eq. (18)}$$

FIG. 8B illustrates a schematic diagram of another example of a DSM 830 partitioned into MSB and LSB paths according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In comparison to FIG. 8A, the partitioned architecture for DSM can be further simplified as shown in FIG. 8B. The DSM 830 includes a LSB signal path that contains an LSB extraction circuit 832, adders 836 and 838, quantizer 842, and a delay 848 ("$Z^{-1}$"). The LSB extraction circuit 832 includes a slicing circuit 833 and a sign operation circuit 834. The quantizer 842 includes an adder 844, a slicing circuit 845 and a sign operation circuit 846. The DSM 830 includes a MSB signal path that contains an MSB extraction circuit 850, which contains a slicing circuit 851 and a sign operation circuit 852. The 16-bit input is fed to the LSB extraction circuit 832 and the MSB extraction circuit 850. The slicing circuit 833 partitions out bits 4 down to 0 for a 5-bit LSB, and the slicing circuit 851 partitions out the remaining bits 15 down to 5 for a 11-bit MSB. Each of the sign operation circuits 834 and 852 convert the input from an unsigned integer to a signed integer. The sign operation circuit 834 feeds the 5-bit LSB signal to the adder 836. The delay 848 feeds its output to the adder 836 such that the adder 836 produces a 7-bit adder signal, which represents the difference between the 5-bit LSB signal and a 6-bit delay signal from the delay 848. This 7-bit adder signal is fed to both the adder 844 and to the adder 838. The output of the adder 844 produces a rounding value signal prior to quantization, which represents the combination of the 7-bit adder signal and a constant value (e.g., $2^{-11}$) fed to the adder 844. The rounding value signal is passed through the slicing circuit 845 and sign operation circuit 846 for the quantization operation. The slicing circuit 845 is configured to produce a 1-bit sliced signal from the 7-bit input signal. The quantizer 842 therefore produces a quantized signal, and provides an error signal e(n) stemming from the quantized signal on a feedback signal path to the adder 838. The adder 838 produces an error feedback signal to the feedback loop filter 848, which represents the difference between the error signal e(n) and the 7-bit adder signal fed from the adder 836. The 11-bit MSB signal produced along the MSB signal path is passed through to the adder 849 for combination with the LSB signal fed from the quantizer 842 to produce an 11-bit output signal y(n).

Since $|e(n)| \leq 2^{-11}$, v(n) has a value in a range of −16 and (31+16), so the v(n) signal path only needs 7 bits, and the v(n)+$2^{-11}$ has a value in a range of 0 to 63. The quantizer would then require slicing [7:5], but since the input is in the range of 0 to 63, only the MSB is needed (e.g., bit 5). In some implementations, the partitioned architecture of the DSM 830 has reduced the critical path from two 16-bit adders (as shown in FIG. 8A) to one 7-bit adder (e.g., 834) and one 6-bit adder (e.g., 840).

FIG. 8C illustrates a schematic diagram of another example of a DSM 860 illustrated in FIG. 8B according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

For purposes of explanation, only the distinguishing features from the DSM 830 illustrated in FIG. 8B will be discussed in reference to FIG. 8C. The DSM 860 includes error terminals 861 and 862, and delay blocks 864 and 866. The error terminal 861 is connectable to an error terminal of a previous DSM parallel stage, and the error terminal 862 is connectable to an error terminal of a next DSM parallel stage. The interconnection between the next and previous DSM stages provides a similar function as that of the feedback loop filter 848, and outperforms the DSM architecture illustrated in FIG. 8B. In some aspects, the error signal fed from the previous DSM parallel stage may include a delay similar to that of a feedback loop filter. The delay block 864 can be added between the quantizer 842 and the MSB/LSB adder 849, and the delay block 866 can be added after the MSB extraction circuit 850 and prior to the MSB/LSB adder 849. In comparison to the DSM architecture of FIG. 8B, the delay blocks 864 and 866 enhance the timing of the DSM 860 by reducing the critical paths on each of the MSB and LSB signal paths.

Figure 8D:
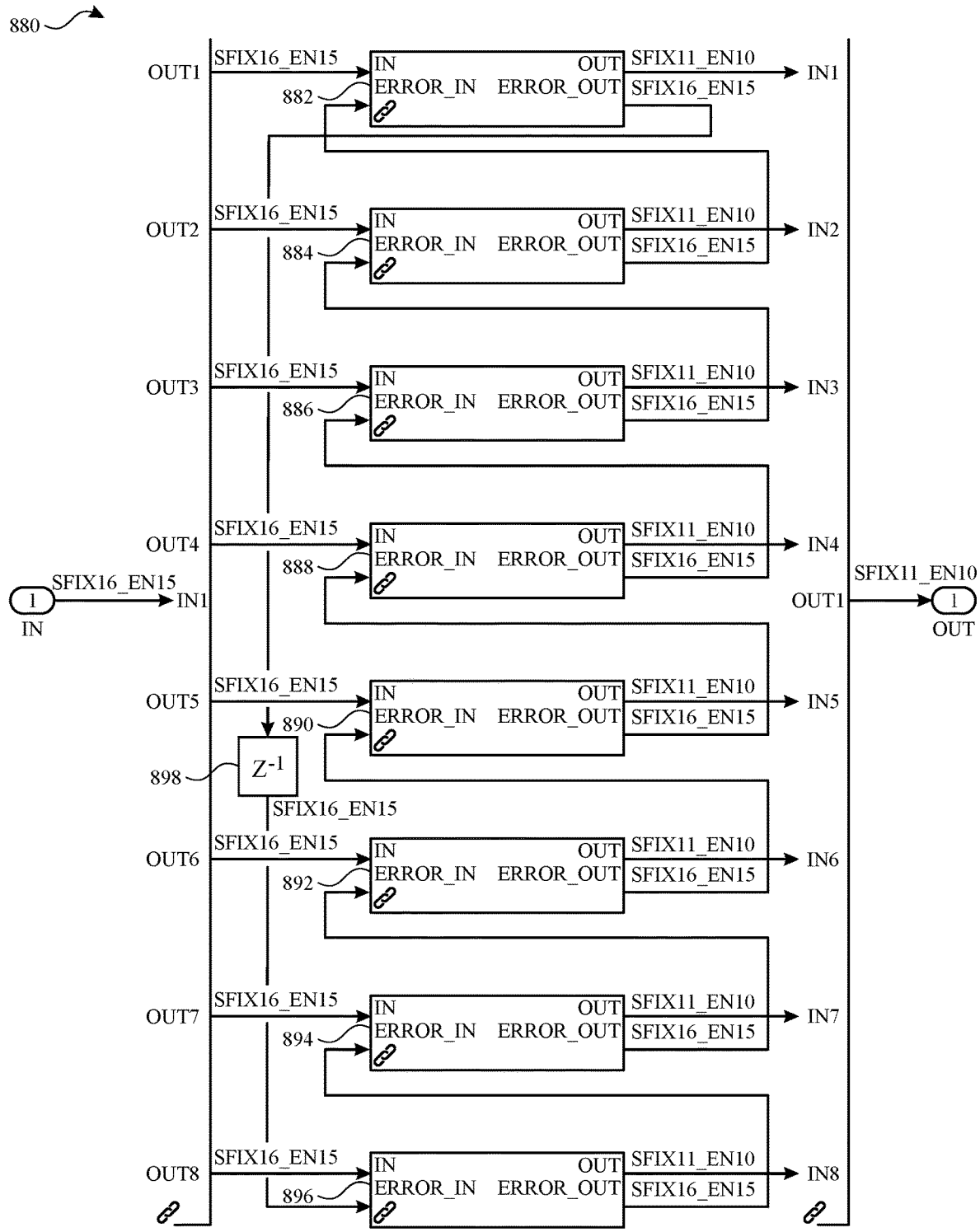
FIG. 8D illustrates a schematic diagram of an example of an 8-branch parallel DSM architecture according to one or more implementations of the subject technology.

FIG. 8D illustrates a schematic diagram of an example of an 8-branch parallel DSM architecture 880 according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The parallel DSM architecture 880 includes DSM blocks 882, 884, 886, 888, 890, 892, 894 and 896 and a feedback loop filter 898. The DSM blocks are interconnected in parallel through error terminals of each DSM block. The DSM block 882 receives a first 16-bit input and produces a first 11-bit output. The DSM block 896 receives an eighth 16-bit input and produces an eighth 11-bit output. In some aspects, a feedback loop filter (e.g., 898) delays an error signal from a last modulation stage and feeds a delayed error signal to a first modulation stage. For example, the error output signal from the DSM block 882 is fed to the feedback loop filter 898, which then feeds its output signal to the error input terminal of the DSM block 896. Each of the remaining DSM blocks receive a respective 16-bit input and produce a respective 11-bit output, and are interconnected with neighboring DSM blocks through their respective error terminals. The individual 11-bit streams from each of the DSM blocks can be multiplexed to produce a single 11-bit stream.

Figure 9A:
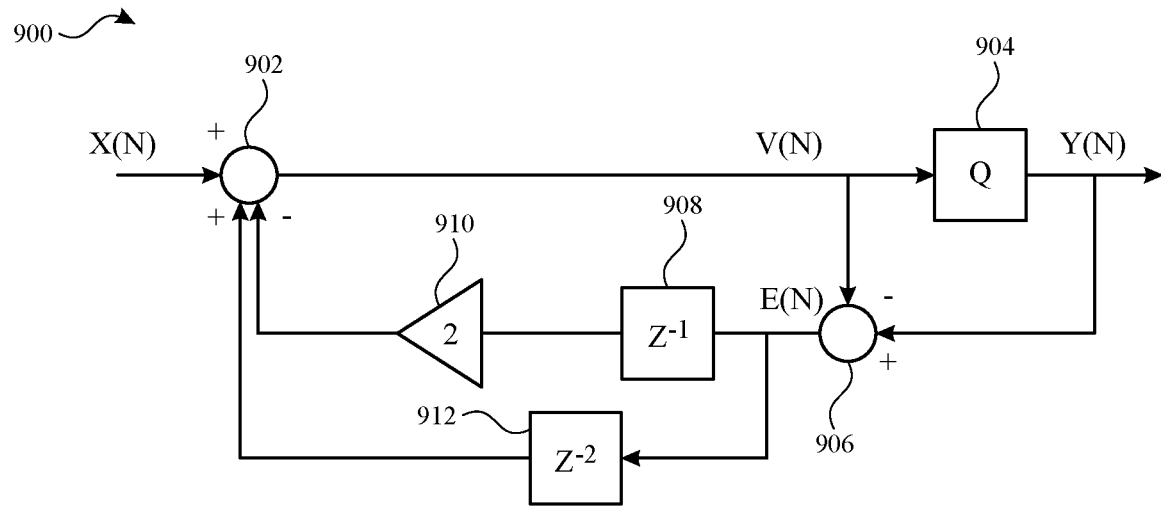
FIG. 9A illustrates a schematic diagram of an example of a second-order DSM architecture according to one or more implementations of the subject technology.

FIG. 9A illustrates a schematic diagram of an example of a second-order DSM architecture 900 according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The DSM architecture 900 includes adders 902 and 906, quantizer 904 ("Q"), a delay 908 ("$Z^{-1}$"), a two-delay 912 ("$Z^{-2}$"), and a feedback coefficient 910. The input x(n) is fed to the adder 902. The output of the adder 902 produces an adder signal v(n), which represents the difference between the input x(n), a coefficient signal from the feedback coefficient 910, and a loop filter error signal from the two-delay 912. The adder signal v(n) is fed to the quantizer 904 and to the adder 906. The quantizer 904 produces an output signal y(n), and provides an error signal e(n) stemming from the output signal y(n) on a feedback signal path to the adder 906. The adder 906 produces an error feedback signal to the delay 908 and to the two-delay 912, which represents the difference between the error signal e(n) and the adder signal v(n).

The input-output relation for the $2^{nd}$ order DSM as illustrated in FIG. 9A can be expressed:

$$y(n)=Q[x(n)-2e(n-1)+e(n-2)] \qquad \text{Eq. (19)}$$

$$y(n)=x(n)+e(n)-2e(n-1)+e(n-2) \qquad \text{Eq. (20)}$$

Figure 9B:
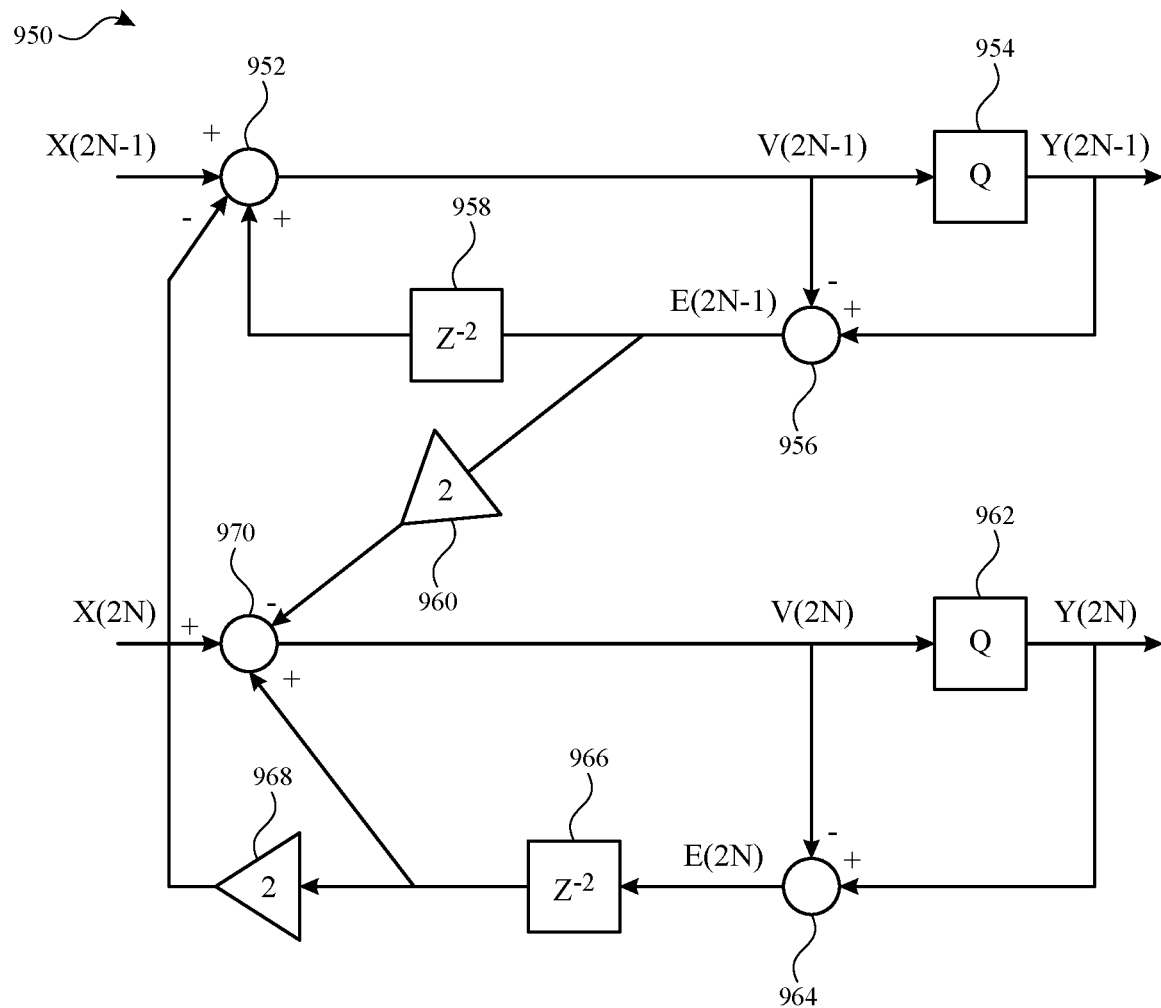
FIG. 9B illustrates a schematic diagram of an example of a parallel architecture of a second-order DSM according to one or more implementations of the subject technology.

FIG. 9B illustrates a schematic diagram of an example of a parallel architecture of a second-order DSM 950 according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The DSM 950 includes adders 952, 956, 964 and 970, quantizers 954 and 962 ("Q"), and delays 958 and 966 ("$Z^{-2}$"), and feedback coefficients 960 and 968. A first input x(2n) is fed to the adder 970, and a second input x(2n−1) is fed to the adder 952. The output of the adder 970 produces a first adder signal v(2n), which represents the difference between the input x(2n), a coefficient signal from the feedback coefficient 960 and an error feedback signal from the two-delay 966. The first adder signal v(2n) is fed to the quantizer 962 and to the adder 964. The quantizer 962 produces an output signal y(2n), and provides an output error signal stemming from the output signal y(2n) on a feedback signal path to the adder 964. The adder 964 produces a first error feedback signal e(2n) and feeds this signal to the two-delay 966, which represents the difference between the output error signal and the first adder signal v(2n). The two-delay 966 feeds its output to the adder 970 and to the feedback coefficient 968. The adder 952 produces a second adder signal v(2n−1), which represents the difference between the second input x(2n−1), a coefficient signal from the feedback coefficient 968 and a loop filter error signal from the two-delay 958. The second adder signal v(2n−1) is fed to the quantizer 954 and to the adder 956. The quantizer 954 produces an output signal y(2n−1), and provides an output error signal stemming from the output signal y(2n−1) on a feedback signal path to the adder 956. The adder 956 produces a second error feedback signal e(2n−1) and feeds this signal to the two-delay 958 and to the feedback coefficient 960, which represents the difference between the second adder signal v(2n−1) and the output error signal.

In some implementations, the two sample delays in the block diagram of FIG. 9B is equivalent to a single sample delay at half the rate. The input-output relation for a parallel second-order DSM can be expressed as:

$$y(2n-1)=Q[x(2n-1)-2e(2n-2)+e(2n-3)] \quad \text{Eq. (21)}$$

$$y(2n-1)=x(2n-1)+e(2n-1)-2e(2n-2)+e(2n-3) \quad \text{Eq. (22)}$$

$$y(2n)=Q[x(2n)-2e(2n-1)+e(2n-2)] \quad \text{Eq. (23)}$$

$$y(2n)=x(2n)+e(2n)-2e(2n-1)+e(2n-2) \quad \text{Eq. (24)}$$

Figure 10A:
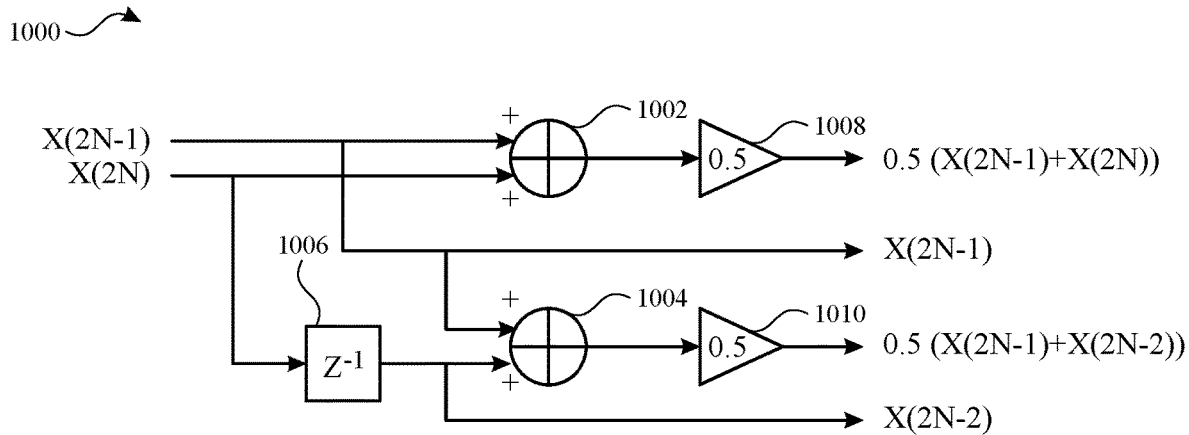
FIGS. 10A and 10B illustrate schematic diagrams of examples of parallel architectures for interpolation filters according to one or more implementations of the subject technology.
Figure 10B:
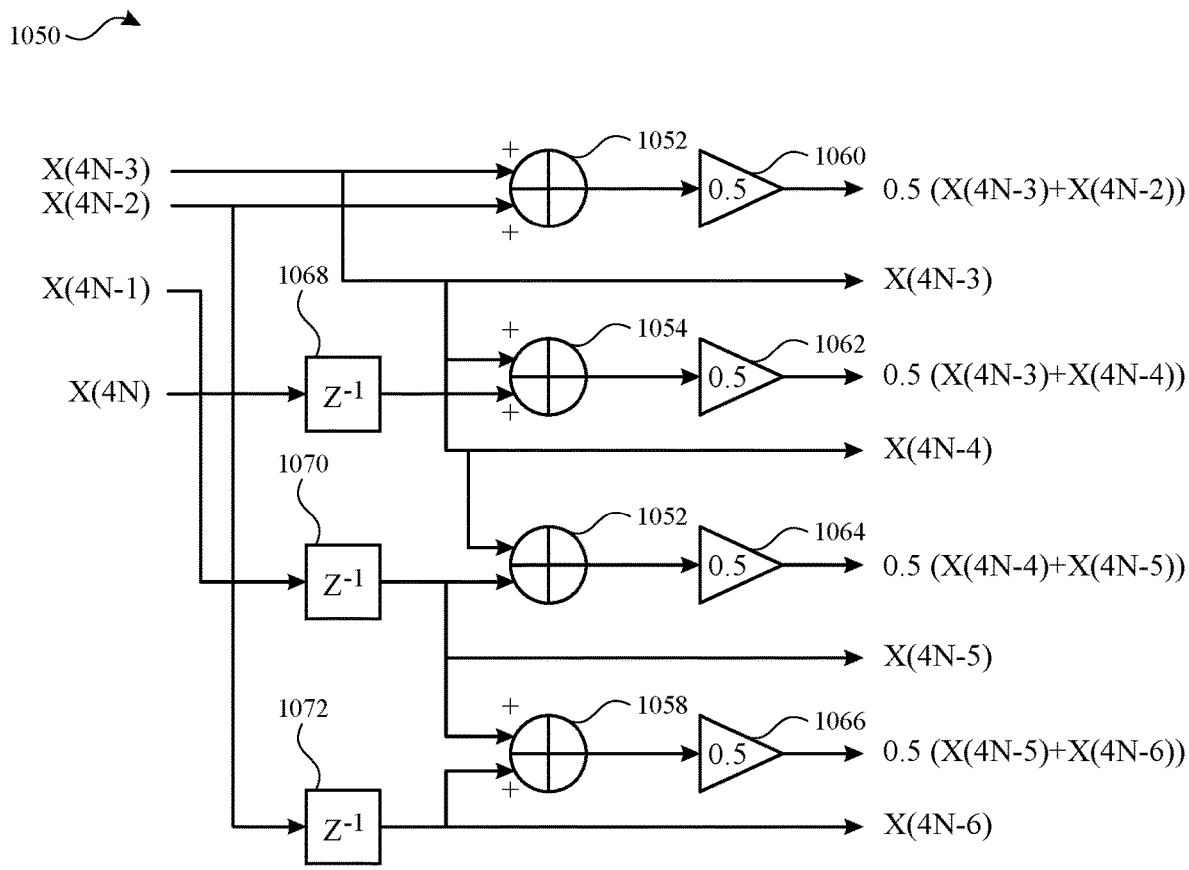

FIGS. 10A and 10B illustrate schematic diagrams of examples of parallel architectures for interpolation filters according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In FIG. 10A, an interpolation filter 1000 with a parallel architecture is illustrated. The interpolation filter 1000 includes adders 1002 and 1004, feed-forward delay 1006, and coefficients 1008 and 1010. A first input x(n) is fed to the adder 1002 and to the feed-forward delay 1006. A second input x(n−1) is fed to the adders 1002 and 1004 and passed through as output signal x(2n−1). The adder 1002 produces an adder signal that is fed to the coefficient 1008 to produce output signal 0.5 (x(n−1)+x(2n)). The feed-forward delay 1006 feeds the adder 1004 with its delay signal, which is also passed through to produce output signal x(2n−2). The adder 1004 produces an adder signal that is fed to the coefficient 1010 to produce output signal 0.5 (x(2n−1)+x(2n−2)).

In some implementations, the interpolation filter 1000 is configured to operate at a sample rate of about 4.8 GHz, but clocking at a lesser rate of 600 MHz. The coefficients of the interpolation filter 1000 may be set to a value of 0.5, but the coefficient value can be any arbitrary number depending on implementation. However, the coefficients are minimized (e.g., 0.5) to minimize power and area of the interpolation filter 1000. As discussed above, the interpolation filter 1000 can be represented as FIR filter, in particular, a 3-tap FIR filter. As illustrated in FIG. 10A, the interpolation filter 1000 as a 3-tap FIR filter is transformed with a level of parallelism, where L=4. In this respect, the effective sampling rate is about 2.4 GHz (or 4×600 MHz).

In FIG. 10B, an interpolation filter 1050 with a parallel architecture is illustrated. The interpolation filter 1050 includes adders 1052, 1054, 1056 and 1058, feed-forward delays 1068, 1070 and 1072, and coefficients 1060, 1062, 1064 and 1066. A first input x(4n) is fed to the feed-forward delay 1068, which feeds the adders 1054 and 1056 with its delay signal, which is passed through to produce output signal x(4n−4). A second input x(4n−1) is fed to the feed-forward delay 1070, which feeds the adders 1056 and 1058 with its delay signal, which is passed through to produce output signal x(4n−5). A third input x(4n−2) is fed to the adder 1052 and to the feed-forward delay 1072, which feeds its delay signal to the adder 1058 and is also passed through to produce output signal x(4n−6). A fourth input x(4n−3) is fed to the adders 1052 and 1054, and is also passed through to produce output signal x(4n−3). The adder 1052 produces an adder signal that is fed to the coefficient 1060 to produce output signal 0.5 (x(4n−3)+x(4n−2)). The adder 1054 produces an adder signal that is fed to the coefficient 1062 to produce output signal 0.5 (x(4n−3)+x(4n−4)). The adder 1056 produces an adder signal that is fed to the coefficient 1064 to produce output signal 0.5 (x(4n−3)+x(4n−5)). The adder 1058 produces an adder signal that is fed to the coefficient 1066 to produce output signal 0.5 (x(4n−3)+x(4n−6)).

In some implementations, the coefficients of the interpolation filter 1050 may be set to a value of 0.5, but the coefficient value can be any arbitrary number depending on implementation. The interpolation filter 1050 also can be represented as FIR filter, in particular, a 3-tap FIR filter. As illustrated in FIG. 10B, the interpolation filter 1050 as a 3-tap FIR filter is transformed with a level of parallelism, where L=8 to represent eight parallel signal output paths. In some implementations, the interpolation filter 1000 is also configured to be clocked at a rate of 600 MHz. In this respect, the effective sampling rate is about 4.8 GHz (or 8×600 MHz).

Figure 11A:
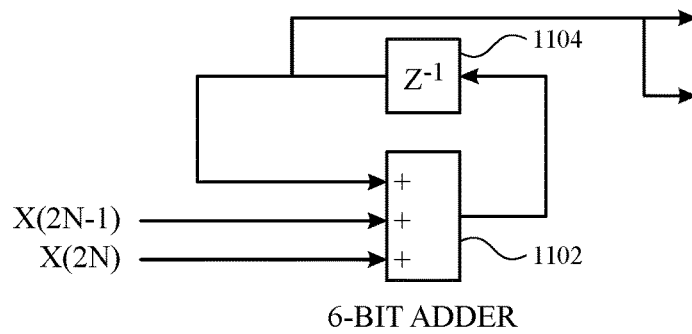
FIGS. 11A and 11B illustrate schematic diagrams of examples of serial and parallel architectures for a DWA algorithm according to one or more implementations of the subject technology.
Figure 11B:
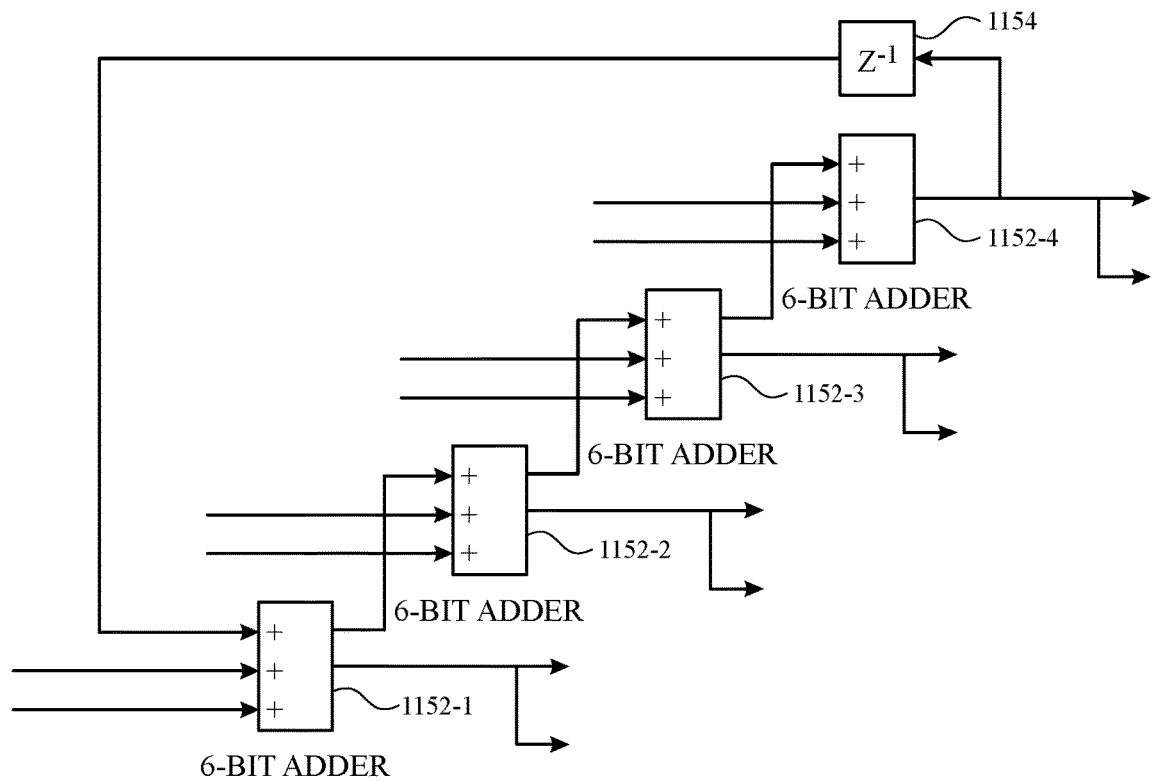

FIGS. 11A and 11B illustrate schematic diagrams of examples of serial and parallel architectures for a DWA algorithm according to one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In some implementations, the DWA algorithm 1100 is configured to operate at a sample rate of about 4.8 GHz, but clocking at a lesser rate of 600 MHz. In FIG. 1A, the DWA algorithm 1100 includes a serial circuit topology that includes an adder 1102 and a feedback delay 1104. In some aspects, the adder 1102 is a 6-bit adder, but the bitwidth of the adder can be any arbitrary value depending on implementation. In some aspects, the feedback delay 1104 is a first-order delay ($Z^{-1}$). A first input x(2n) and second input x(2n) are fed to the adder 1102. The adder 1102 feeds its output to the feedback delay 1104. The feedback delay 1104 drives its delay signal back to the adder 1102 as a third input, and also drives its delay signal to produce an output signal. The output signal may be expressed as:

$$\text{shift}=\text{mod}(\text{shift}+x(2n-1)+x(2n),64) \quad \text{Eq. (25)}$$

In FIG. 11B, the DWA algorithm 1150 includes a parallel circuit topology that includes adders 1152-1, 1152-2, 1152-3, 1152-4 and a feedback delay 1154. In some aspects, each of the adders is a 6-bit adder, but the bitwidth of the adder can be any arbitrary value depending on implementation. In some aspects, the feedback delay 1154 is a first-order delay ($Z^{-1}$). A first input x(2n) and second input x(2n) are fed to each of the adders. The adder 1152-1 feeds its output to the next adder 1152-2 as a third input. The adder 1152-2 feeds its output to the next adder 1152-3 as a third input. The adder 1152-3 feeds its output to the last adder 1152-4 as a third input. The feedback delay 1104 drives its delay signal back to the adder 1152-1 as a third input. The last adder 1152-4 feeds its adder signal to the feedback delay 1154. Each of the adders drives its adder signal to produce part of the multi-bit output signal.

Figure 12:
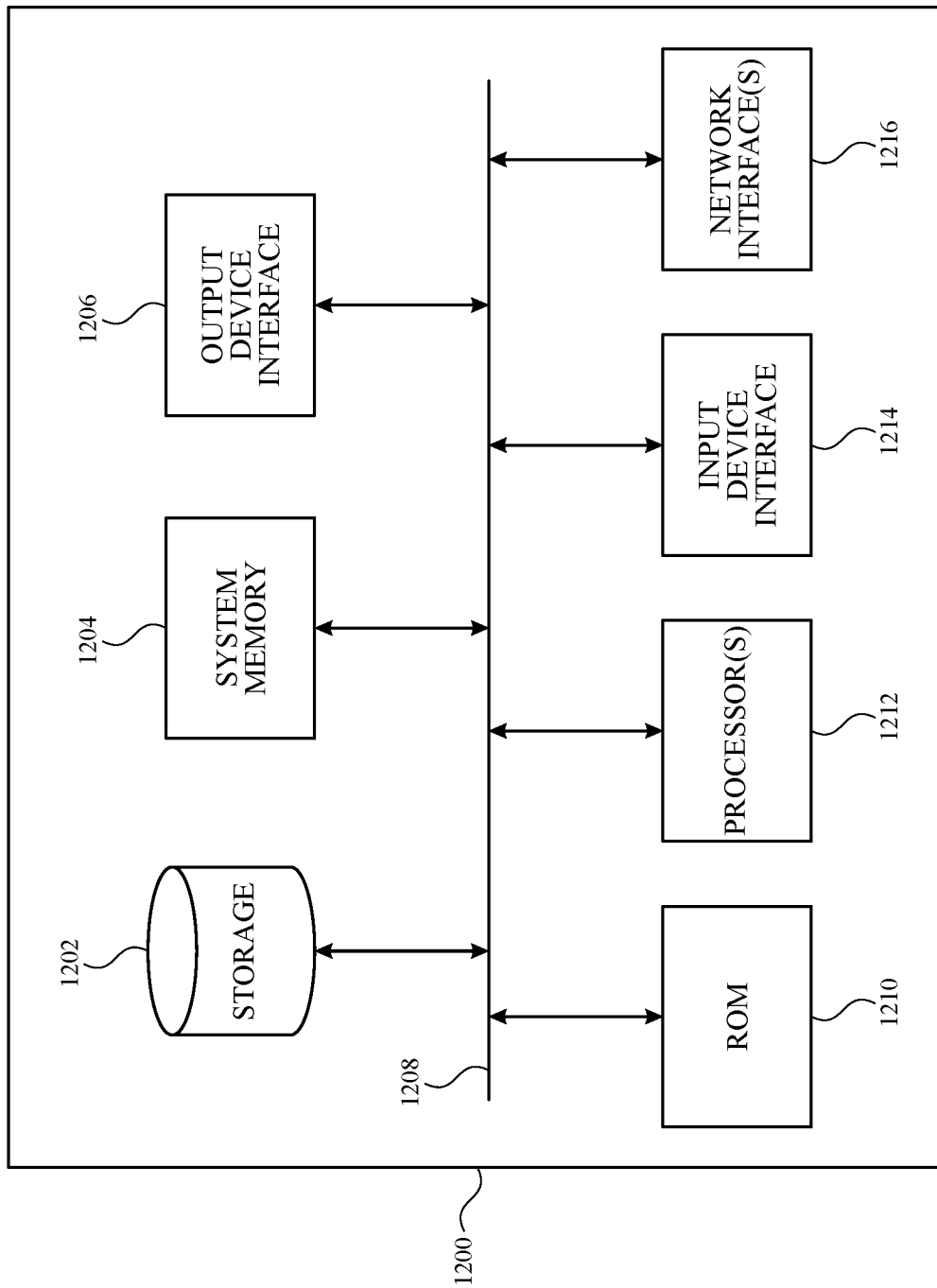
FIG. 12 conceptually illustrates an electronic system with which any implementations of the subject technology are implemented.

FIG. 12 conceptually illustrates an electronic system 1200 with which one or more implementations of the subject technology may be implemented. The electronic system 1200, for example, can be a network device, a media converter, a desktop computer, a laptop computer, a tablet computer, a server, a switch, a router, a base station, a receiver, a phone, or generally any electronic device that transmits signals over a network. Such an electronic system 1200 includes various types of computer readable media and interfaces for various other types of computer readable media. In one or more implementations, the electronic system 1200 is, or includes, one or more of the wireless communication devices 118-132. The electronic system 1200 includes a bus 1208, one or more processing unit(s) 1212, a system memory 1204, a read-only memory (ROM) 1210, a permanent storage device 1202, an input device interface 1214, an output device interface 1206, and a network interface 1216, or subsets and variations thereof.

The bus 1208 collectively represents all system, peripheral, and chipset buses that communicatively connect the numerous internal devices of the electronic system 1200. In one or more implementations, the bus 1208 communicatively connects the one or more processing unit(s) 1212 with the ROM 1210, the system memory 1204, and the permanent storage device 1202. From these various memory units, the one or more processing unit(s) 1212 retrieves instructions to execute and data to process in order to execute the processes of the subject disclosure. The one or more processing unit(s) 1212 can be a single processor or a multi-core processor in different implementations.

The ROM 1210 stores static data and instructions that are needed by the one or more processing unit(s) 1212 and other modules of the electronic system. The permanent storage device 1202, on the other hand, is a read-and-write memory device. The permanent storage device 1202 is a non-volatile memory unit that stores instructions and data even when the electronic system 1200 is off. One or more implementations of the subject disclosure use a mass-storage device (such as a magnetic or optical disk and its corresponding disk drive) as the permanent storage device 1202.

Other implementations use a removable storage device (such as a floppy disk, flash drive, and its corresponding disk drive) as the permanent storage device 1202. Like the permanent storage device 1202, the system memory 1204 is a read-and-write memory device. However, unlike the permanent storage device 1202, the system memory 1204 is a volatile read-and-write memory, such as random access memory. System memory 1204 stores any of the instructions and data that the one or more processing unit(s) 1212 needs at runtime. In one or more implementations, the processes of the subject disclosure are stored in the system memory 1204, the permanent storage device 1202, and/or the ROM 1210. From these various memory units, the one or more processing unit(s) 1212 retrieves instructions to execute and data to process in order to execute the processes of one or more implementations.

The bus 1208 also connects to the input device interface 1214 and the output device interface 1206. The input device interface 1214 enables a user to communicate information and select commands to the electronic system. Input devices used with the input device interface 1214 include, for example, alphanumeric keyboards and pointing devices (also called "cursor control devices"). The output device interface 1206 enables, for example, the display of images generated by the electronic system 1200. Output devices used with the output device interface 1206 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations include devices that function as both input and output devices, such as a touchscreen. In these implementations, feedback provided to the user can be any form of sensory feedback, such as visual feedback, auditory feedback, or tactile feedback, and input from the user can be received in any form, including acoustic, speech, or tactile input.

Finally, as shown in FIG. 12, the bus 1208 also couples the electronic system 1200 to one or more networks (not shown) through one or more network interfaces 1216. In this manner, the computer can be a part of one or more network of computers (such as a local area network ("LAN"), a wide area network ("WAN"), or an Intranet, or a network of networks, such as the Internet. Any or all components of the electronic system 1200 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (e.g., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa.

Headings and subheadings, if any, are used for convenience only and do not limit the subject disclosure.

What is claimed is:

1. A modulator, comprising:
a plurality of modulation stages arranged in parallel to input and output terminals of the modulator and interconnected to one another in series, wherein each of the plurality of modulation stages is configured to:
combine a first error feedback signal from a prior modulation stage of the plurality of modulation stages with a first digital input signal to produce a first adder signal, wherein the first error feedback signal includes a delay from the prior modulation stage,
convert the first adder signal having a first bit width into a quantized signal having a second bit width smaller than the first bit width,
combine a second error signal based on the quantized signal and the first adder signal to produce a second error feedback signal, and
provide the second error feedback signal to a subsequent modulation stage of the plurality of modulation stages.

2. The modulator of claim 1, wherein each of the plurality of modulation stages is configured to perform delta-sigma modulation on the first digital signal.

3. The modulator of claim 1, wherein one or more of the plurality of modulation stages includes a first-order delta-sigma modulator.

4. The modulator of claim 1, wherein one or more of the plurality of modulation stages includes a second-order delta-sigma modulator.

5. The modulator of claim 1, wherein at least one modulation stage of the plurality of modulation stages includes a plurality of quantizers and a plurality of feedback loops coupled to respective ones of the plurality of quantizers.

6. The modulator of claim 5, wherein one or more of the plurality of feedback loops includes a first-order feedback loop filter.

7. The modulator of claim 5, wherein one or more of the plurality of feedback loops includes a second-order feedback loop filter.

8. The modulator of claim 1, wherein each of the plurality of modulation stages comprises:
a first adder and a second adder, the first adder being configured to combine the first error feedback signal and the first digital input signal to produce the first adder signal, the second adder being configured to combine the first adder signal and the second error signal to produce the second error feedback signal;
a quantizer coupled to the first adder and to the second adder, the quantizer being configured to generate the quantized signal from the first adder signal and provide the quantized signal to an output of the modulation stage and the second error signal to the second adder; and
a feedback loop filter configured to delay the second error feedback signal to produce the second error feedback signal.

9. The modulator of claim 1, wherein outputs of the plurality of modulation stages having a first frequency are multiplexed to produce a serialized output having a second frequency greater than the first frequency.

10. The modulator of claim 1, wherein each of the plurality of modulation stages is partitioned into a first stream carrying a first portion of the first digital signal that corresponds to a most-significant-bit (MSB) signal path and to a second stream carrying a second portion of the first digital signal that corresponds to a least-significant-bit (LSB) signal path.

11. The modulator of claim 10, wherein the MSB signal path comprises an MSB extraction circuit configured to extract the first portion from the first digital input signal, the first portion having a first number of bits.

12. The modulator of claim 11, wherein the LSB signal path comprises:
an LSB extraction circuit configured to extract the second portion from the first digital input signal, the second portion having a second number of bits smaller than the first number of bits;
a first adder and a second adder, the first adder being configured to combine the first error feedback signal and the first digital input signal to produce the first adder signal, the second adder being configured to combine the first adder signal and the second error signal to produce the second error feedback signal; and
a quantizer coupled to the first adder and to the second adder, the quantizer being configured to generate the quantized signal from the first adder signal and provide the quantized signal to an output of the modulation stage and the second error signal to the second adder.

13. The modulator of claim 12, wherein each of the LSB extraction circuit and the MSB extraction circuit comprises:
a slicing circuit configured to partition the first digital input signal into a sliced signal having a corresponding number of bits smaller than that of the first digital signal; and
a sign operation circuit connected in series with the slicing circuit and is configured to perform a sign operation on the sliced signal.

14. The modulator of claim 12, wherein the quantizer comprises:
a third adder configured to combine a constant value with the first adder signal to produce a third adder signal having a rounded value;
a slicing circuit configured to partition the third adder signal into a sliced quantization signal having a corresponding number of bits smaller than that of the first adder signal; and
a sign operation circuit connected in series with the slicing circuit and is configured to perform a sign operation on the sliced quantization signal.

15. The modulator of claim 12, wherein each of the plurality of modulation stages comprises an output adder, and wherein the first portion produced along the MSB signal path is passed through to the output adder for combination with the quantized signal fed from the quantizer to produce a second digital signal.

16. The modulator of claim 12, wherein the LSB signal path comprises a delay connected between the first and second adders.

17. The modulator of claim 12, wherein the LSB signal path comprises a plurality of error terminals, wherein the plurality of error terminals includes a first error terminal that is connected to an error terminal of a previous modulation stage of the plurality of modulation stages and to the first adder, and wherein the plurality of error terminals includes a second error terminal that is connected to an error terminal of a subsequent modulation stage of the plurality of modulation stages and to the second adder.

18. The modulator of claim 17, further comprising:
an output adder connected to the MSB signal path and to the LSB signal path; and a plurality of delay blocks arranged on each of the MSB signal path and the LSB signal path, wherein the plurality of delay blocks includes a first delay block arranged between the quantizer and the output adder and a second delay block arranged between the MSB extraction circuit and the output adder.

19. The modulator of claim 1, further comprising:

a feedback loop filter connected to a first modulation stage of the plurality of modulation stages and to a last modulation stage of the plurality of modulation stages, wherein the feedback loop filter delays an error signal from the last modulation stage and feeds a delayed error signal to the first modulation stage.

20. A delta-sigma modulation device, comprising:

means for combining a first error feedback signal from a prior modulation stage of a plurality of modulation stages arranged in parallel to one another with an input digital signal to produce an adder signal;

means for converting the adder signal having a first bit width to a quantized signal having a second bit width smaller than the first bit width;

means for combining a second error signal based on the quantized signal and the adder signal to produce a second error feedback signal; and means for providing the second error feedback signal to a subsequent modulation stage of the plurality of modulation stages, wherein the first error feedback signal includes a delay from the prior modulation stage.

\* \* \* \* \*